US006065141A

United States Patent [19]
Kitagawa

[11] Patent Number: 6,065,141
[45] Date of Patent: May 16, 2000

[54] SELF-DIAGNOSABLE SEMICONDUCTOR MEMORY DEVICE HAVING A REDUNDANT CIRCUIT AND SEMICONDUCTOR APPARATUS HAVING THE SAME IN WHICH THE MEMORY DEVICE CANNOT BE ACCESSED FROM OUTSIDE THE SEMICONDUCTOR APPARATUS

[75] Inventor: Masaya Kitagawa, Kawasaki, Japan

[73] Assignee: Fujitsu Limited, Kawasaki, Japan

[21] Appl. No.: 08/096,261

[22] Filed: Jul. 26, 1993

[30] Foreign Application Priority Data

Jul. 27, 1992  [JP]  Japan ................................. 4-199583

[51] Int. Cl.[7] ............................. G11C 29/00; H02H 3/05
[52] U.S. Cl. ................................ 714/711; 714/6; 714/8; 714/710
[58] Field of Search ........................ 371/10.3; 365/200; 364/245.3, 268.5, 269.2; 714/711, 710, 5–9, 11, 13, 42, 54

[56] References Cited

U.S. PATENT DOCUMENTS

| | | | |
|---|---|---|---|
| 4,321,695 | 3/1982 | Redwine et al. | 365/200 |
| 4,745,582 | 5/1988 | Fukushi | 371/10.3 X |
| 4,849,939 | 7/1989 | Muranaka et al. | 365/200 |
| 4,890,262 | 12/1989 | Hashimoto et al. | 365/200 |
| 4,989,181 | 1/1991 | Harada | 365/200 |
| 5,109,360 | 4/1992 | Inagumi et al. | 365/200 |
| 5,123,016 | 6/1992 | Muller et al. | 371/10.3 |
| 5,134,616 | 7/1992 | Barth, Jr. et al. | 371/10.3 |
| 5,184,327 | 2/1993 | Matsuda et al. | 365/201 |
| 5,195,057 | 3/1993 | Kasa et al. | 365/200 |
| 5,321,697 | 6/1994 | Fromm et al. | 371/10.1 |
| 5,357,473 | 10/1994 | Mizuno | 365/201 |

FOREIGN PATENT DOCUMENTS

| | | |
|---|---|---|
| 60-254499 | 12/1985 | Japan . |
| 63-79298 | 4/1988 | Japan . |
| 64-55799 | 3/1989 | Japan . |
| 3-116497 | 5/1991 | Japan . |
| 3-160697 | 7/1991 | Japan . |
| 3-181097 | 8/1991 | Japan . |
| 4-132095 | 5/1992 | Japan . |

*Primary Examiner*—Dieu-Minh T. Le
*Attorney, Agent, or Firm*—Armstrong, Westerman, Hattori, McLeland & Naughton

[57] ABSTRACT

An object of the present invention is that, in a semiconductor memory device having both a redundant circuit and a diagnostic circuit, a memory test for detecting positions of defective memory cells in order to replace the defective memory cells with the redundant circuit can be easily carried out by using the diagnostic circuit. A semiconductor memory device of the present invention includes a normal memory portion, a redundant circuit to replace defective memory cells of the normal memory portion by a units of a word line or a bit line, and a self-diagnostic circuit, and further, in order to realize the object, the device includes a defective cell position storage circuit for storing position information of each defective memory cell when the self-diagnostic circuit detects defective memory cells, and an output circuit for converting position information stored in the defective cell position storage circuit into serial data and outputting the position information.

15 Claims, 19 Drawing Sheets

Fig. 6
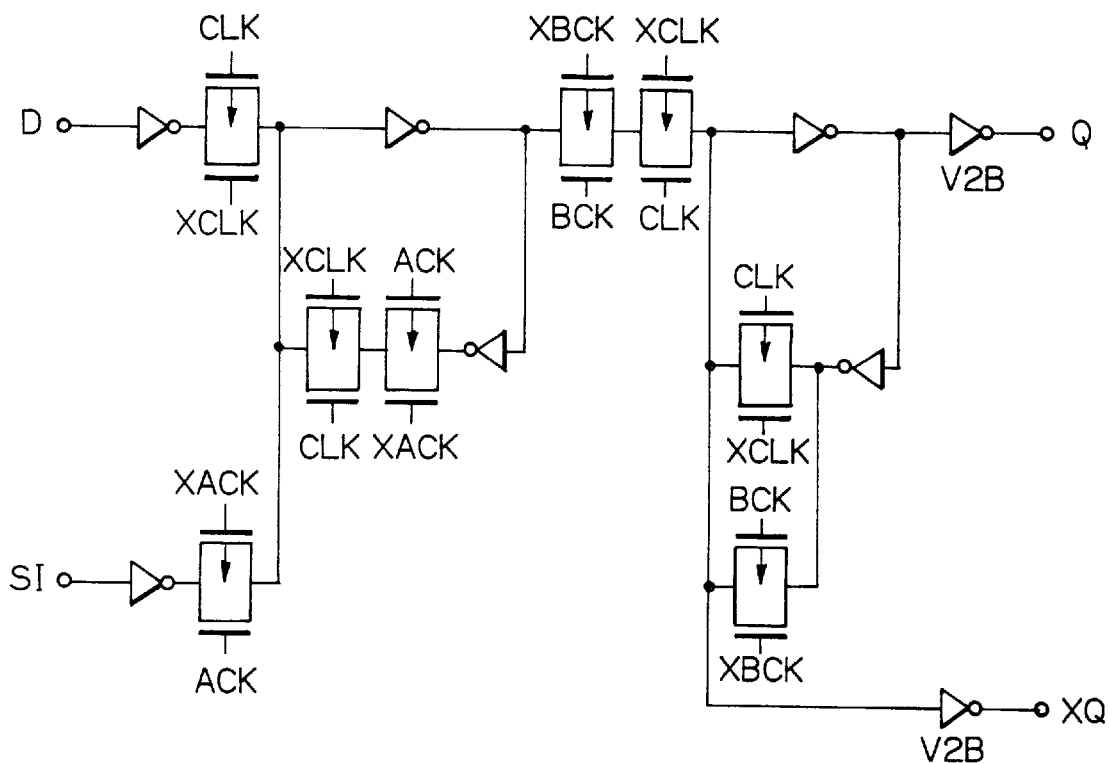
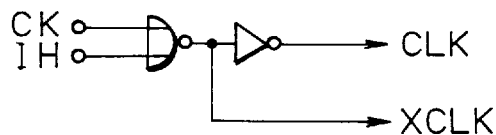
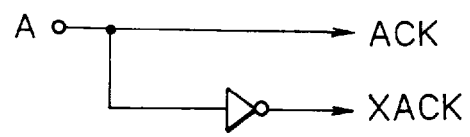
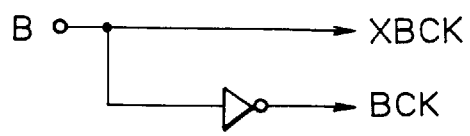

TO MEMORY DATA INPUT

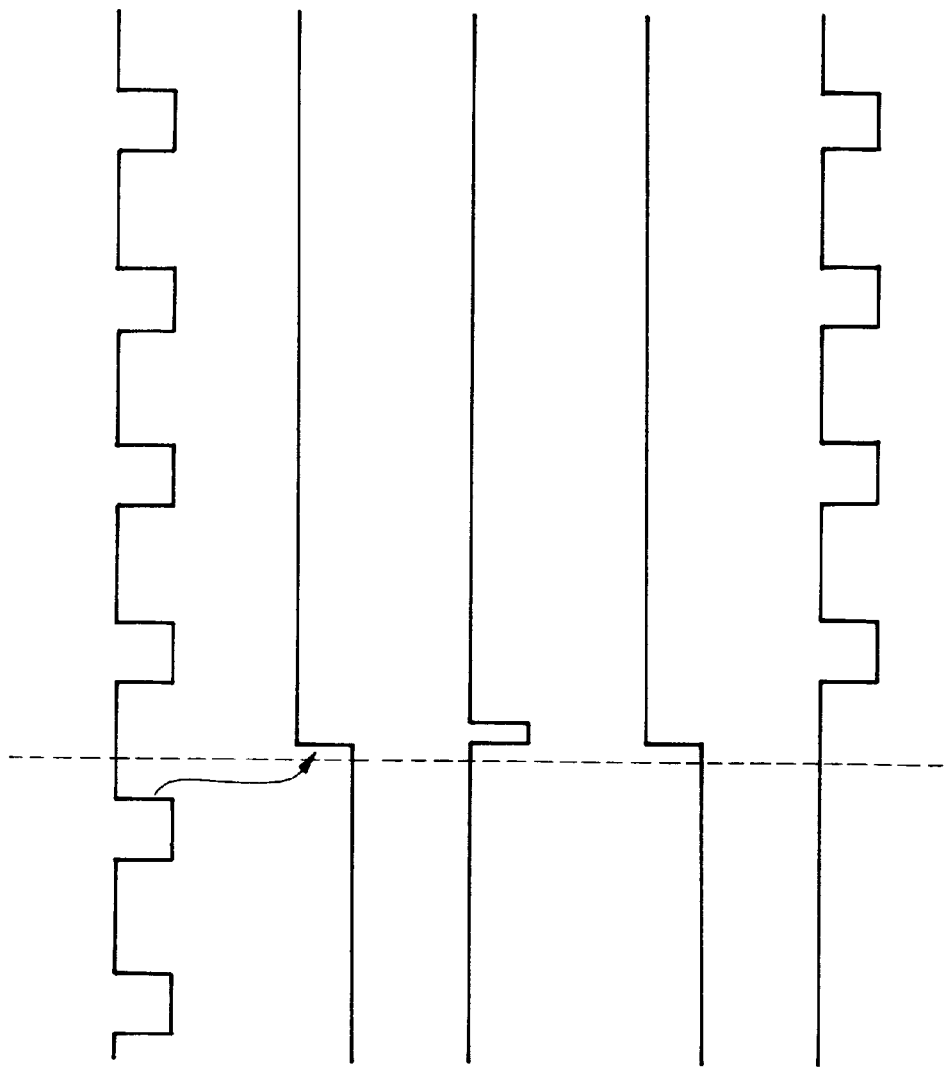
Fig. 15A CK
Fig. 15B OUT EN
Fig. 15C LATCH PULSE
Fig. 15D NODE A
Fig. 15E SHIFT CLOCK

SELF-DIAGNOSABLE SEMICONDUCTOR MEMORY DEVICE HAVING A REDUNDANT CIRCUIT AND SEMICONDUCTOR APPARATUS HAVING THE SAME IN WHICH THE MEMORY DEVICE CANNOT BE ACCESSED FROM OUTSIDE THE SEMICONDUCTOR APPARATUS

BACKGROUND OF THE INVENTION (1) Field of the Invention

The present invention relates to a self-diagnosable semiconductor memory device having a redundant circuit, and particularly, relates to a semiconductor memory device which can be combined with a random logic circuit into a single package in such a form that the semiconductor memory cannnot be directly accessed from outside of the package, and a semiconductor apparatus having the semiconductor memory in such form.

(2) Description of the Related Art

The scale of a semiconductor memory devices has become larger and larger in recent years, and production yield and reliabilty are required to be further improved.

For improving the production yield, there is a method in which a redundant circuit is provided in the semiconductor memory device, and, when defective portions are detected in a normal circuit portion, each defective portion is replaced with a portion of the redundant circuit having the same function. In this way, the production yield is improved because each produced device having at least one defect in the normal circuit portion, which would have been discarded in the past, can be changed to a functioning apparatus.

The semiconductor memory device has a constitution in which word lines and bit lines (or pairs of bit lines) are arranged in a lattice and memory cells are arranged at intersections of the word lines and the bit lines, and each memory cell can be accessed by selectively activating word lines and bit lines. The redundant circuit for replacing defective memory cells generally has a constitution in which each replacement is carried out by a unit of a word line or a bit line. Therefore, all memory cells connected to the word line or the bit line to which each defective memory cell is connected are simultaneously replaced. Namely, the replacement of each defective memory cell is carried out by a row or a column of the memory cell matrix. The redundant circuit is composed of the redundant memory cell arrays and a redundant switching circuit which switches the redundant memory cell arrays to be accessed when the replaced rows or columns of the normal memory cells are accessed.

In one known switching method in the redundant switching circuit, positions of the replaced rows or columns are stored, and, when an address comparing circuit detects the replaced rows or columns to be accessed by comparing an address signal with the stored positions, the replaced rows or columns are controlled so as not to be accessed and the redundant memory cell arrays are controlled to be accessed by the address comparing circuit. In another known switching method in the redundant switching circuit, lines from a row decoder or a column decoder to the replaced word lines or bit lines are cut off, and the redundant memory cell arrays are connected to corresponding positions of the row decoder or the column decoder. Alternatively, in other types of redundant switching circuits, the storage of the replaced rows or columns, and the cutting and the connecting of lines are carried out by fusing of fuse circuits or laser trimming operations.

In order to replace defective memory cells, the existence of defective memory cells needs to be detected, and, when defective memory cells exist, the positions of the defective memory cells need to be detected. The positions of the word lines connected to the defective memory cells must be detected when the replacing operation is carried out by a word line, and the positions of the bit lines connected to the defective memory cells must be detected when the replacing operation is carried out by a bit line. In an operation to detect positions of the defective memory cells, by sequentially changing an address signal applied to address terminals of the memory, predetermined data is written into each memory cell and is read from the memory cell, and it is confirmed whether the read data coincides to the written data. When the read data does not coincide to the written data, the memory cell is judged to be defective, and the address of the memory cell is stored. The replacement with the redundant circuit is carried out by using the laser trimming operation and so forth according to the determined positions of the defective memory cells. Consequently, in the normal memory test of the prior art, the memory device is operated from outside via input/output (I/O) terminals, and outputs of the memory device are checked outside. In this way, positions of the defective memory cells are detected.

Japanese Unexamined Patent Publication (Kokai) No.4-132095 discloses a test apparatus of a memory device in which defective memory cells are replaced with a redundant circuit by a unit of a row or a column.

Japanese Unexamined Patent Publication (Kokai) Nos.60-254499 and 64-55799 disclose semiconductor memory devices in which the positions of the defective memory cells replaced with the redundant circuit can be read from outside of the devices.

The semiconductor memory device disclosed in Japanese Unexamined Patent Publication (Kokai) Nos.64-55799 includes a programmable ROM for storing positions of word lines or bit lines connected to defective memory cells replaced with the redundant circuit, and contents of the programmable ROM can be output to address terminals. In this way, a user can also detect positions of the replaced memory cells from outside of the device.

In the semiconductor memory devices disclosed in the above documents, the positions of the defective memory cells replaced with the redundant circuit can be read out to outside. However, every operation of the memory test for replacing defective memory cells with the redundant circuit, which include an application of an address signal for accessing each memory cell, is carried out from outside of the device via terminals. An operation of comparing the written data and the read data is also carried out outside of the device. Therefore, the semiconductor memory device needs to be directly accessable from outside.

Further, in order to improve reliability of the memory device, a self-diagnostic circuit is implemented into the memory device, which detects the occurrence of defective memory cells after the device is embedded into an apparatus. In a test carried out by the self-diagnostic circuit, after predetermined data is written into every memory cell, stored data is read out from every memory cell and it is judged whether or not the read data coincides with the written data. When a defective memory cells exist, the self-diagnostic circuit reports the existence of the defective memory cells. Therefore, this test of the self-diagnostic circuit is similar to the test for replacing defective memory cells with the redundant circuit, however, information relating to positions of the defective memory cells is not output in this test of the self-diagnostic circuit. The reason this information is not output is that, since defective memory cells newly generated after the completion of the device cannot be replaced with the redundant circuit, the self-diagnostic circuit only needs to output information relating to an existence of defective memory cells.

Japanese Unexamined Patent Publications (Kokai) No.64-55799 discloses a semiconductor memory device which includes redundant memory cells, a selection circuit for selecting the redundant memory cells, and a self-testing circuit. This memory device can relieve problems caused by defective memory cells generated after completion of a device. However, a defective memory cell address storage circuit which can store the addresses of the defective memory cells after the completion of the device needs to include a programmable ROM. Since the area of the programmable ROM is larger than that of a storage circuit trimmed by a laser beam, a problem that the scale of the device becomes large occurs. Further, since a high voltage which is not used in a normal mode is required to write data into the programmable ROM, the high voltage must be supplied from outside or a booster circuit needs to be implemented in the memory device. When the high voltage is supplied from outside, an apparatus using the memory device needs a high voltage source. When the high voltage is supplied from the booster circuit implemented in the memory device, the memory device becomes large and complicated.

Further, in recent years, a semiconductor device in which a random logic device and a memory device are combined together in a same package is used. In this type semiconductor device, the memory device cannot be accessed from outside. The memory capacity of the memory device implemented in this type of device has recently become larger and larger. Therefore, in this type of memory device, the redundant circuit is also implemented in order to improve the production yield, and the self-diagnostic circuit is also implemented in order to increase reliablity.

As described above, since the memory device cannot be accessed from outside, the memory test for replacing defective memory cells with the redundant circuit cannot be carried out via I/O terminals of the semiconductor device. Of course, the number of the I/O terminals of the semiconductor device is limited, therefore, I/O terminals to directly access the implemented memory device cannot be increased. In a known semiconductor device of this type, a plurality of electrode pads which are not connected to the I/O terminals are arranged in the device, and the memory test is carried out by contacting probes of the testing apparatus to the electrode pads. However, in this device, the semiconductor device becomes large, complicated and expensive since the electrode pads have large areas and the amount of wiring increases. In another known semiconductor device of this type, a switching circuit which switches wiring between the random logic device and the memory device to be connected to the I/O terminals only when the memory test is carried out is provided. However, in this device, the switching circuit needs to be further implemented, and the amount of wiring increases. Therefore, the semiconductor device also becomes large, complicated and expensive. This problem is difficult to overcome when the number of the electrode pads increases.

SUMMARY OF THE INVENTION

An object of the present invention is to realize a semiconductor memory device having both a redundant circuit and a diagnostic circuit in which a memory test for detecting positions of defective memory cells in order to replace the defective memory cells with the redundant circuit can be easily carried out.

An other object of the present invention is that, in a semiconductor device having both a random logic circuit device and a semiconductor memory device which is not directly accessable from outside, a memory test of the semiconductor memory device for replacing defective memory cells with a redundant circuit can be carried out without complicated circuits.

According to the present invention, a semiconductor memory device includes a normal memory portion having a memory cell matrix, a redundant circuit having memory cell arrays to replace defective memory cells of the normal memory portion and a self-diagnostic circuit for testing whether or not every memory cell operates normally. In the memory cell matrix, a plurality of memory cells are arranged at intersections of word lines and bit lines, and the redundant circuit replaces defective memory cells of the normal memory portion in units of a word line or a bit line, namely, so that all memory cells connected to a word line or bit line to which a defective memory cell is connected are simultaneously replaced. Further, the device includes a defective cell position storage circuit for storing a position of either a word line or a bit line connected to each defective memory cell when the self-diagnostic circuit detects defective memory cells, and an output circuit for converting position information indicating positions of the word lines or bit lines connected to the defective memory cells stored in the defective cell position storage circuit into serial data and outputting the position information. When the replacing operation is carried out by a unit of a word line, the positions of word lines connected to defective memory cells are stored. When the replacing operation is carried out by a unit of a bit line, the positions of bit lines connected to defective memory cells are stored.

In the semiconductor memory device of the present invention, when the self-diagnostic circuit detects defective memory cells, the defective cell position storage circuit stores positions of either the word lines or the bit lines connected to the defective memory cells, therefore, the positions that need to be replaced can be determined when contents of the defective cell position storage circuit are output. This means that the memory test for replacing defective memory cells of the normal memory portion with the redundant circuit can be carried out by the self-diagnostic circuit. Since an operation of generating data signals and address signals and an operation of checking output signals in the memory test are automatically carried out by the self-diagnostic circuit, the memory test becomes easy.

A semiconductor device according to the present invention includes a semiconductor memory device as described above, a random logic circuit device and a plurality of input and output terminals. In the device, the semiconductor memory device is only accessable from the random logic circuit device and is not accessable from the input and output terminals, and signals of the output circuit of the semiconductor memory device are output to a part of the input and output terminals.

In the semiconductor device of this type, the memory test for replacing defective memory cells of the normal memory portion with the redundant circuit cannot be carried out from outside because the memory device is not accessible from outside. However, in the device of the present invention, since the self-diagnostic circuit automatically carries out the memory test, the memory test can be easily carried out without changing wiring and adding electrode pads or complicated circuits. Further, the output circuit outputs the position information of the defective memory cells after converting serial data, therefore, the number of the input/output terminals for the test result can be reduced to a minimum.

BRIEF DESCRIPTION OF THE DRAWINGS

The present invention will be more clearly understood from the description as set forth below with reference to the accompanying drawings, wherein:

FIG. 6 is a circuit diagram showing a constitution of a flip-flop used in the second embodiment;

FIGS. 15A to 15E are time-charts showing operations of the shift register of the third embodiment;

DESCRIPTION OF THE PREFERRED EMBODIMENTS

Figure 1:
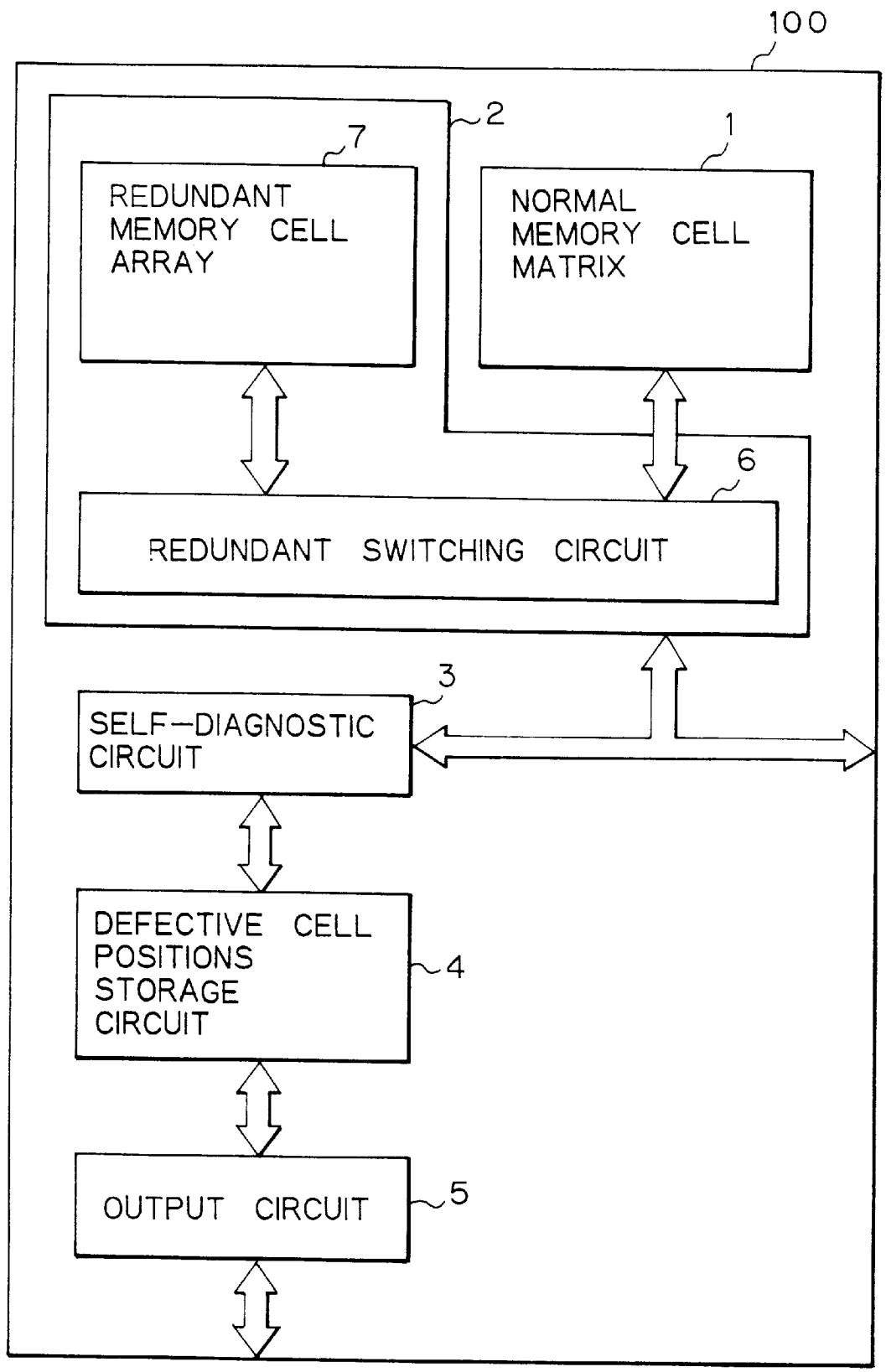
FIG. 1 is a block diagram showing a total constitution of a semiconductor memory device of a first embodiment of the present invention.

FIG. 1 is a block diagram showing a total constitution of a semiconductor memory device of a first embodiment of the present invention. In FIG. 1, reference numeral 100 designates a semiconductor memory device. The semiconductor memory device 100 includes a normal memory portion 1 having a memory cell matrix, a redundant circuit 2 to replace defective memory cells of the normal memory portion in a production stage, a self-diagnostic circuit 3 which automatically tests whether or not every memory cell normally operates, a defective cell position storage circuit 5 which stores positions of defective memory cells when the self-diagnostic circuit detects defective memory cells, and an output circuit which converts data stored in the defective cell position storage circuit into serial data and outputs the serial data.

Figure 2:
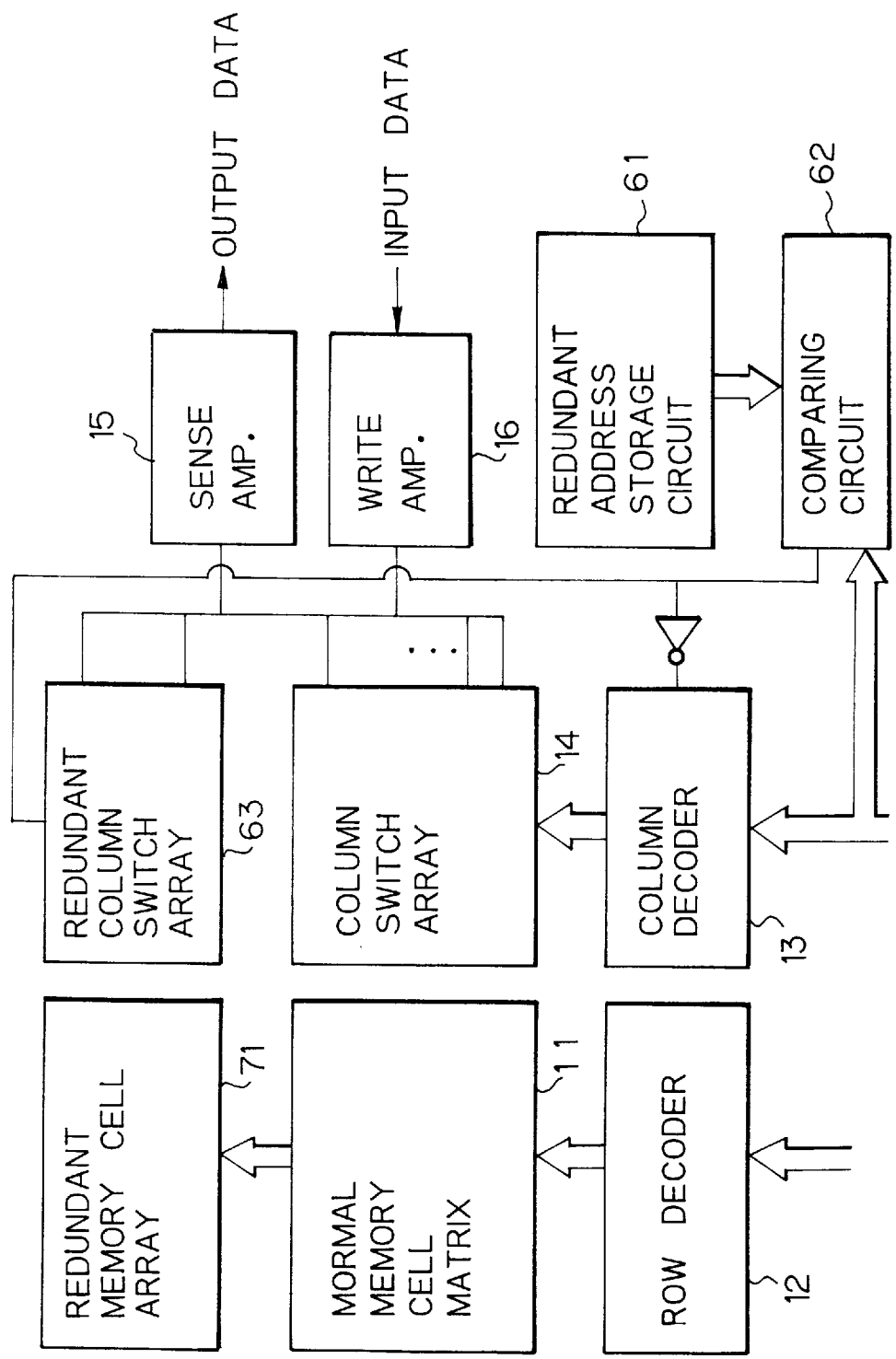
FIG. 2 is a block diagram showing a constitution of a normal memory portion and a redundant circuit of the first embodiment.

FIG. 2 is a block diagram showing a detailed constitution of a normal memory portion and a redundant circuit of FIG. 1.

In FIG. 2, 11 designates a normal memory cell matrix, 12 designates a row decoder, 13 designates a column decoder, 14 designates a column switch array, 15 designates a sense amplifier, 16 designates a write amplifier, 71 designates a redundant memory cell array, 61 designates a redundant address storage circuit, 62 designates a comparing circuit, 63 designates a redundant column switch array. This circuit constitution is well-known, therefore, only the redundant mechanism is briefly described.

In the memory device of this embodiment, each replacing operation to the redundant memory cell array is carried out by units of a bit line, namely, all memory cells connected to a bit line to which a defective memory cell is connected are replaced. The redundant memory cell arrays 71 is composed of a number of columns, for example, eight columns. In such a case, when it is assumed that every defective memory cell is connected to different bit line, eight defective memory cells can be replaced. The redundant address storage circuit 61 stores addresses of replaced columns, and the comparing circuit 62 judges whether or not an input address signal coincides with one address of the replaced columns and outputs a coincidence signal when an address coinciding with the input address signal exists in the stored addresses. The coincidence signal controls the column decoder 13 so that every bit line is not selected in the column switch array 14, and only a bit line in the redundant column switch array 63 is selected. In this way, the columns of redundant memory cell arrays 71 are selected in place of the normal memory cell matrix 11.

In this embodiment, each replacing operation is carried out by units of a bit line, however, it can be also carried out by units of a word line. Further, in this embodiment, the addresses of the replaced columns are stored and the comparing circuit 62 performs switching operations when the input address signal coincides with one of the stored addresses. However, the replacing operation can also be realized by cutting lines from a column decoder to column switches connected to the replaced bit lines and connecting redundant column switches to the column decoder.

Figure 3:
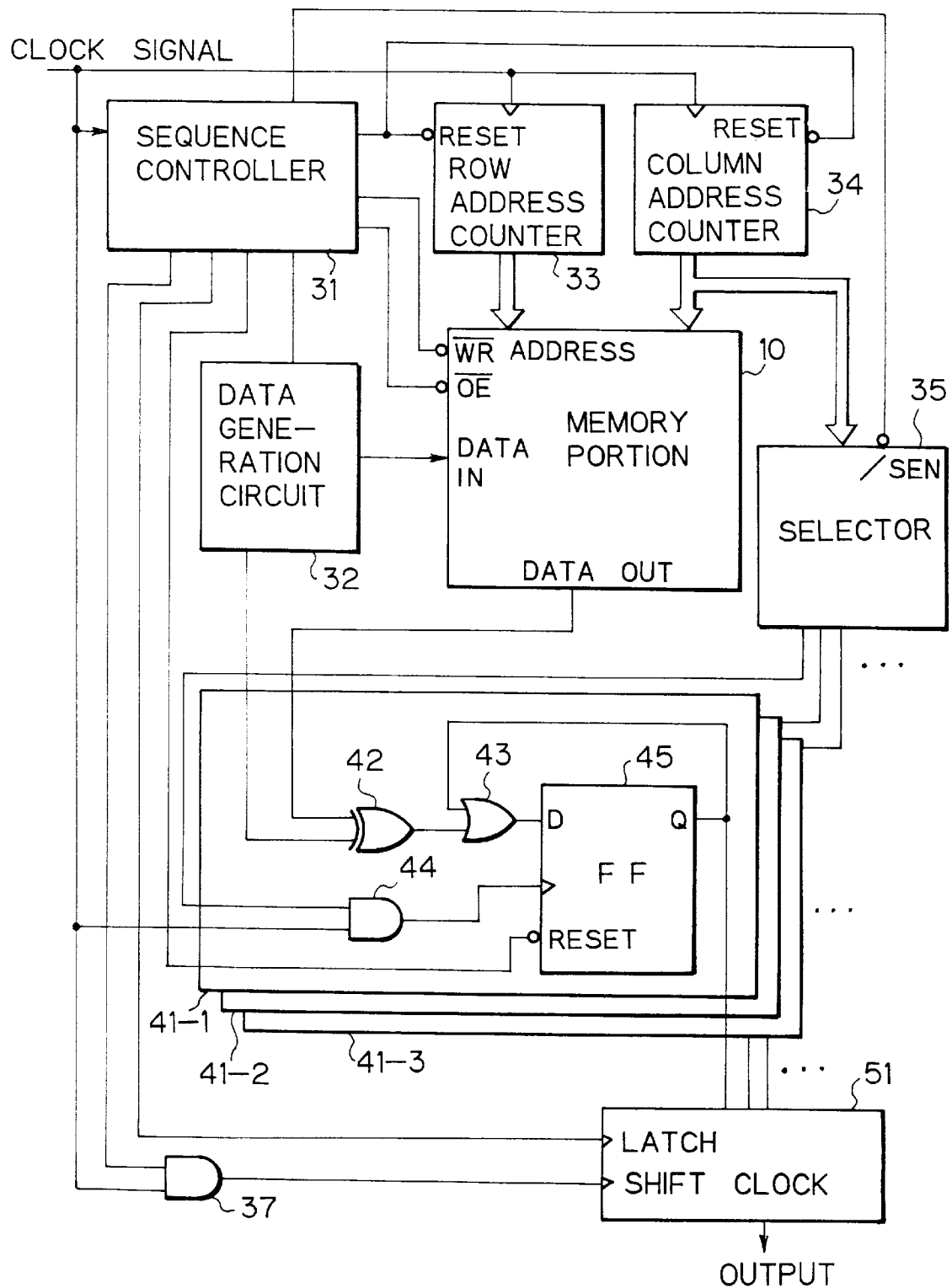
FIG. 3 is a block diagram showing a constitution of a self-diagnostic circuit, a defective cell position storage circuit and an output circuit of the first embodiment.

FIG. 3 is a block diagram showing a detailed constitution of a self-diagnostic circuit, a defective cell position storage circuit and an output circuit of the first embodiment.

In FIG. 3, 10 designates a memory device composed of the normal memory portion 1 and the redundant circuit 2; 31 designates a sequence controller which generates control signals used in a self-diagnostic operation; 32 designates a data generation circuit for generating test data written into the memory cells; 33 and 34 respectively designate a row address generation counter and a column address generation counter, these counters generate address signals used when the test data is written into the memory cells and the written data is read out from the memory cells in the memory test operation; and 41-1, ..., 41-N designate defective cell position storage circuits each of which judges whether or not each column has at least one defective memory cell, and stores a position of a bit line when the column has at least one defective memory cell. The defective cell position storage circuits 41-i receives the original test data written into the memory cells from the data generation circuit 32 and reads test data from the memory cells, and both test data are compared. The comparison result is also stored in the defective cell position storage circuit 41-i. The number of the defective cell position storage circuits corresponds a number of the columns, namely, the number of the bit lines. In this specification, N designates the number of the bit lines; 35 designates a selector to select one of the defective cell position storage circuits corresponding to the testing column according to the column address signal generated by the column address counter 34; and 51 designates a shift register which converts data stored in the defective cell position storage circuits into serial data and outputs the data to outside. Therefore, this shift register 51 includes a number of input nodes corresponding to the number of the defective cell position storage circuits which corresponds to the number of the columns, namely, the number of the bit lines. Reference 37 designates an AND gate to control a period in which a shift clock signal is applied to this shift register 51.

Each defective cell position storage circuit 41-i is composed of an Exclusive OR gate 42, an OR gate 43, an AND gate 44 and a flip-flop 45. The EXOR gate 42 outputs a signal "High" when the read test data is different from the written test data. The OR gate 43 receives an output of the EXOR gate 42 and the flip-flop 45, and an output of the OR gate 43 is connected to a data input terminal of the flip-flop 45. When the output signal of the EXOR gate 42 once changes to "High", and the output signal of the flip-flop 45 changes to "High", the output of the flip-flop 45 stays "High" even if the following memory cells are normal, and the output signal of the EXOR gate 42 returns to "Low" because the output signal of the flip-flop 45 returns to the OR gate 43. The AND gate 44 receives a clock signal and a signal output from the selector 35 which selects one of the defective cell position storage circuit corresponding to the column being read in an operation of reading the memory test result. The output of the AND gate 44 is connected to a clock input of the flip-flop 45. In this way, a clock signal is input into the flip-flip 45 only when data is being read from the memory cells included in the corresponding column.

The shift register 51 latches output signals of the defective cell position storage circuits 41-1, ..., 41-N according to a latch signal output from the sequence controller 31, and outputs the latched data as serial data of 1 bit according to a shift clock.

FIGS. 4A to 4H are time-charts showing an operation of the circuit of FIG. 3. Operation of the circuit of FIG. 3 in the memory test is described with reference to FIGS. 4A to 4H.

In the memory test for replacing defective memory cells with the redundant circuit, pre-determined data, for example, "0" or "1" is written into every memory cell of the normal memory portion 1. The written data is read out from each memory cell, and the read data is compared with the pre-determined data to determine whether or not they coincide. When the read data do not coincide with the pre-determined data, the memory cell being accessed is defective. Therefore, the column address of this memory cell is stored. These read out and comparing operations are repeated for each memory cell. The stored column addresses are output after every memory cell is tested. In the memory test, the test data composed of only "0" or "1" is not generally used, but test data composed of complicated patterns is used in order to test data interference between the memory cells. However, in order to simplify the description, test data composed of only "0" or "1" is used in this embodiment.

As shown in FIG. 4A, the memory test is composed of a write period, a read period and a result output period.

In the write period, normal write operations are carried out. The data generation circuit 32 is set to output a predetermined data "0" or "1". This setting is maintained until the read period is finished. The row address counter 33 and the column address counter 34 are reset and count operations are started. Values of the row address counter 33 and the column address counter 34 sequentially change according to the clock signal, and the counting values are applied to the address terminals of the memory device. Therefore, every memory cell is sequentially accessed. The sequence controller 31 synchronously outputs a write enable signal/WE according to each change of the address signal. In this way, the test data set at the data generation circuit 32 is sequentially written into every memory cell. As described above, since the test data is fixed at "0" or "1", every memory cell stores the same data. In the write period, the selector 35, the defective cell position storage circuits 41-1, ..., 41-N and the shift register 51 stop their operations.

At a start of the read period, each flip-flop 45 of the defective cell position storage circuits 41-1, 41-N is set to output "0" by a reset signal output from the sequence controller 31, the row address counter 33 and the column address counter 34 are reset and start count operations. In this embodiment, the row address changes from a minimum value to a maximum value while the column address changes by one. Further, the sequence controller 31 starts to output a selector enable signal/SEN to the selector 35. This selector enable signal/SEN is maintained during the read period. While this selector enable signal/SEN is being output, the selector 35 decodes a column address signal output from the column address decoder 34 and outputs a signal "High" to only an AND gate 44 of the defective cell position storage circuit corresponding to the reading column. Therefore, the clock signal is applied only to the flip-flop 45 of the defective cell position storage circuit corresponding to the reading column, and the clock signal is not applied to flip-flops of other defective cell position storage circuits. In this way, only the defective cell position storage circuit corresponding to the reading column carries out operations of comparing and storing, and other defective cell position storage circuits stop their operations and maintain their states.

In the read period, the address signal output from the row address counter 33 and the column address counter 34 sequentially change according to the clock signal, and the sequence controller 31 synchronously outputs a read enable signal/OE according to each change of the address signal. Therefore, test data stored in each memory cell is sequentially read out. The read test data is compared with the written test data, namely, the data stored in the data generation circuit 32 at the EXOR gate 42. The output signal of the EXOR gate 42 is "Low" when both the written test data and the read test data are same. Since each flip-flop 45 is set to output "Low", the output signal of the OR gate 43 is "Low" when the output signal of the EXOR gate 42 is "Low". Therefore, the output signal of the flip-flop 45 stays "Low" while every memory cell included to the column corresponding to that flip-flop 45 is normal.

When a defective memory cell is read and the read test data does not coincide with the written test data, the output signal of the EXOR gate becomes "High" and the output signal of the OR gate 43 also becomes "High", then, the output signal of the flip-flop 45 changes to "High" when the clock signal changes. After the output signal of the flip-flop 45 changes to "High", the "High" state of the output signal of the flip-flop 45 is maintained although the following memory cells are normal and the output of the RXOR gate 42 changes to "Low" since the output signal returns to the OR gate 43. Of course, when two or more defective memory cells exist, and the output signal of the EXOR gate changes to "High" again, the output of the flip-flop 45 is kept "High". In this way, all memory cells of one column are tested to determine whether each memory cell is normal by sequentially changing the row address. When at least one memory cell is defective in the memory cells of the column, the output signal of the flip-flop 45 changes to "High", and the output signal of the flip-flop 45 stays "Low" only when every memory cell of the column is normal.

When the memory test of all memory cells of one column are finished, the counting value of the column address counter 34 increases by one, and the test of memory cells of the next column are started. At this time, the selector 35 outputs a signal "High" only to the AND gate 44 of the next defective cell position storage circuit. Therefore, the clock signal is applied only to the flip-flop 45 of the next defective cell position storage circuit corresponding to the next reading column, and the clock signal is not applied to flip-flops of other defective cell position storage circuit. In this way, only the next defective cell position storage circuit corresponding to the next reading column carries operations of comparing and storing, and other defective cell position storage circuits stop their operations and maintain their states. The test of memory cells of one column is repeated until the test of every memory cell finishes. When every memory cell is tested, the read period finishes. At this time, each defective cell position storage circuit stores information on whether or not there exists at least one defective memory cell in each column.

When the read period finishes, the result output period starts. At a start of the result output period, the row address counter 33 and the column address counter 34 stop their operations, and the memory device 1 enters a "hold" state because the write enable signal /WE and the read enable signal /OE are not applied. Further, the selector outputs a signal "Low" to the AND gate of every defective cell position storage circuit, the clock signal is not applied to every flip-flop 45, and every flip-flop 45 maintains its state. At this time, the sequence controller 31 outputs a latch signal to the shift register 51, and the shift register 51 latches output signals of the defective cell position storage circuits 41-1, . . . , 41-N which indicate test results. A signal from the sequence controller 31 to the AND gate 37 changes from "Low" to "High", and then, the clock signal is applied to a shift clock terminal of the shift register 51. Consequently, the data latched at the shift register 51 is serially output. The order of the output data corresponds to an order of the column address. Namely, the columns corresponding to parts having "1" of the output data have defective memory cells, therefore, these columns need to be replaced with the redundant memory cell arrays.

In this way, a memory test relating to one test data is carried out. Next, a memory test relating to other test data is carried out in the same way described above. For example, the test data is "0" in the first stage, and the test data is set to "1" in the second stage.

The write periods and the read periods of two memory tests having different memory data can be sequentially carried out, and then, the test results are output. The test results obtained in this way include positions of defective memory cells detected in both memory tests.

As described above, the replacement of the defective memory cells with the redundant memory cell arrays is carried out for each column, therefore, the replacement can be carried out when positions of the columns including defective memory cells are obtained.

In this embodiment, the memory test can be carried out by the self-diagnostic circuit. Since an operation of generating data signals and address signals and an operation of checking output signals in the memory test are automatically carried out by the self-diagnostic circuit, the memory test becomes easy. Further, the resulting data can be obtained via only one terminal because the resulting data is converted into serial data.

In the first embodiment, the defective cell position storage circuits 41-1, 41-2, . . . , 41-N and the shift register 51 are provided. However, by using flip-flops each of which can operate by two independent clock signals, the defective cell position storage circuits and the shift register can be combined together. A second embodiment is a memory device in which the defective cell position storage circuits and the shift register are realized by such flip-flops.

Figure 5:
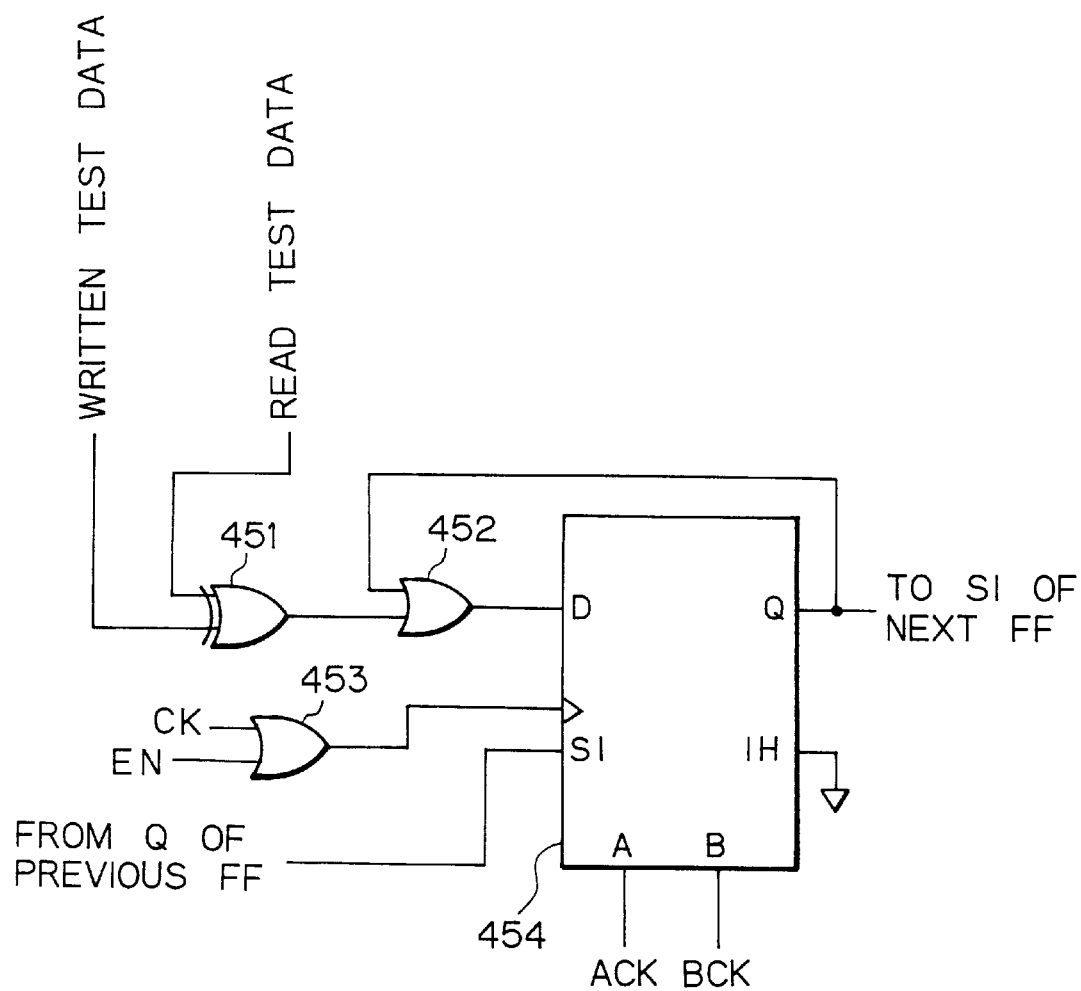
FIG. 5 is a circuit diagram showing a constitution of a defective cell position storage circuit and an output circuit of the second embodiment of the present invention.

FIG. 5 is a circuit diagram showing a constitution of the second embodiment. In FIG. 5, although only one defective cell position storage circuit corresponding to each column of a memory device is shown, a plurality of the defective cell position storage circuits are provided in practice. The number of the defective cell position storage circuits correspond to a number of the columns. Other portions of the memory device of the present invention are the same as those of the first embodiment shown in FIG. 3.

As shown in FIG. 5, each defective cell position storage circuit of the present embodiment includes an Exclusive OR gate 451, an OR gate 452, an AND gate 453 and a flip-flop 454. The Exclusive OR gate 451, the OR gate 452 and the AND gate 453 respectively correspond to those of FIG. 3 and carry out the same functions as those of FIG. 3. The flip-flop 454 operates in response to two independent clock signals. All flip-flops are connected so that an output Q of each flip-flop 454 is input to a serial input SI of the next flip-flop, and an output Q of the last flip-flop 454 is output to outside.

The flip-flop 454 has a constitution as shown in FIG. 6. Since this type of flip-flop is well-known, a detailed explanation of the flip-flop 454 is omitted.

The flip-flop 454 latches data input from an input terminal D according to a clock signal CK while an enable signal EN output from the sequence controller and a pair of clock signals input from outside of the device are held at "High". The latched data is held until new data is input. Further, the flip-flop 454 latches data input from a serial input terminal SI and transfers the data according to a pair of clock signals ACK, BCK while the clock signal CK and the enable signal EN are held at "High".

As shown in FIG. 5, read test data and written test data are compared by the Exclusive OR gate 451, and the comparison result is input to the flip-flop 454 via the OR gate 452. This constitution is the same as that of the first embodiment, therefore, each test result of whether or not at least one defective memory cell is included in that column is input to the flip-flop 454. Since the output terminal of each flip-flop is connected to the serial input terminal SI of the next flip-flop, the test results of all columns can be sequentially transferred to outside by applying the clock signals ACK, BCK while holding the clock signal CK and the enable signal EN at "High".

Next, a third embodiment is described. In the third embodiment, the present invention is applied to a large scale integrated circuit (LSI) which has a random logic circuit device and a memory device.

Figure 7:
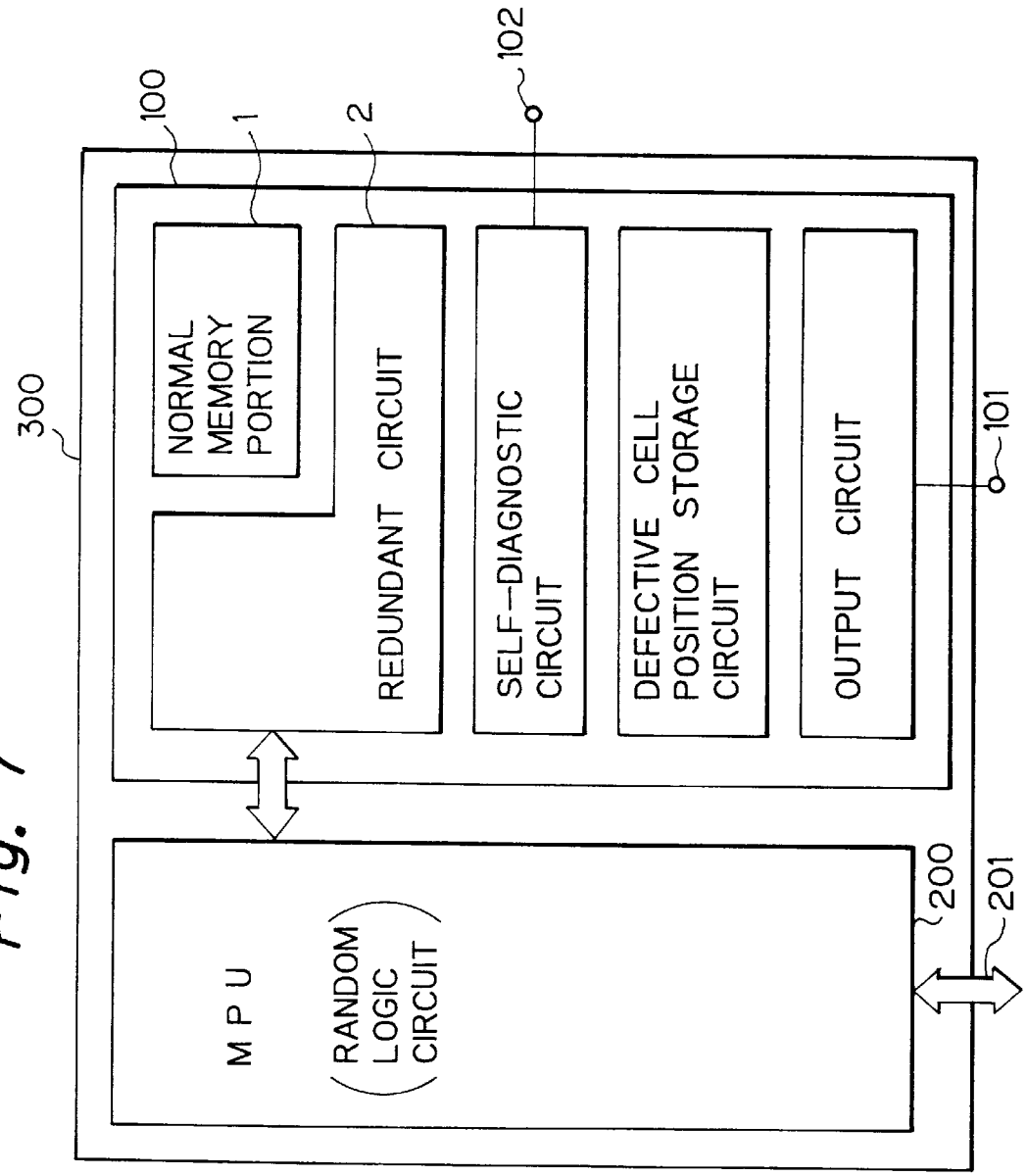
FIG. 7 is a block diagram showing overall constitution of a semiconductor device of a third embodiment of the present invention.

FIG. 7 is a block diagram showing a total constitution of a LSI of a second embodiment. In FIG. 7, 300 designates a LSI, and this LSI 300 includes a microprocessor unit (MPU) 200 corresponding to the random logic circuit device, and a memory device 100. For example, this memory device 100 is a cache memory which is used as a buffer memory to improve the operating speed of the MPU 200. When the memory device 100 shown in FIG. 7 is a cache memory, the memory device 100 is not directly accessable via input/output terminals of the LSI 300, and the number of data bits is large in order to increase a data transfer speed between the MPU 200 and the cache memory 100. For example, a data bus constitution of 1024 words×72 bits is used. The memory device 100 includes a normal memory portion 1, a redundant circuit 2, a self-diagnostic circuit 3, a defective cell position storage circuit 4 and an output circuit 5. The self-diagnostic circuit 3 is activated by a self-diagnostic activation signal supplied via an I/O terminal 102, and it outputs test results to outside via an I/O terminal 101. The replacement of defective memory cells of the normal memory portion 1 with the redundant circuit 2 is carried out by a laser trimming operation according to the test result. Since this replacement is carried out at a production stage, the I/O terminals 101 and 102 are not used after a production stage. Therefore, these I/O terminals 101 and 102 can be electrode pads which are used only in the production stage. The self-diagnostic circuit 3 also operates to detect occurrences of defective memory cells after the LSI is implemented into an apparatus. In these operations after the implementation, the self-diagnostic circuit 3 outputs test result of the self-diagnostic operation to the MPU 200. Generally, the self-diagnostic circuit 3 is designed to automatically start the self-diagnostic operation at intialization stage of the apparatus. Therefore, when the self-diagnostic circuit 3 is designed to automatically start the self-diagnostic operation by a power on reset signal, the memory test for replacing defective memory cells can be automatically started by the start of the power supply.

Further, the self-diagnostic circuit 3 can be designed to start its operation by a signal from the MPU 200, therefore, the memory test for replacing defective memory cells can be automatically started according to the signal from the MPU 200.

Next, the constitution of the memory portion of the third embodiment is described. As described above, this memory portion has a data bus constitution of 1024 words×72 bits, therefore, 72-bit data are simultaneously written or read. Each replacing operation is carried out by units of a data bit line.

Figure 8:
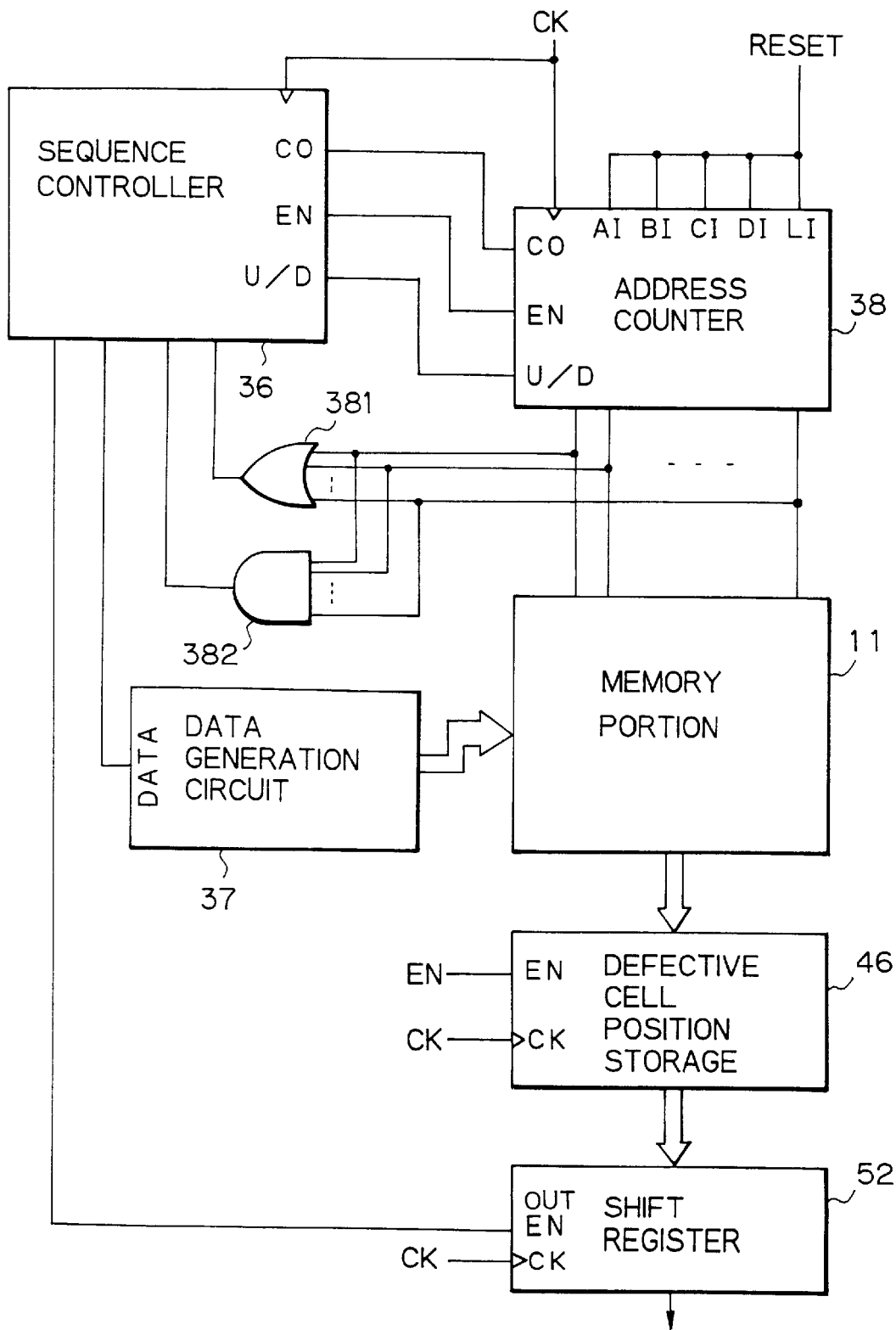
FIG. 8 is a block diagram showing a constitution of a memory portion included in the semiconductor device of the third embodiment.

FIG. 8 is a block diagram showing a detailed constitution of a self-diagnostic circuit, a defective cell position storage circuit and an output circuit of the memory portion of the third embodiment.

In FIG. 8, reference numeral 11 designates a memory portion composed of the normal memory portion and the redundant circuit; 36 designates a sequence controller which generates control signals used in a self-diagnostic operation; 37 designates a data generation circuit for generating test data written into the memory cells; 38 designates an address generation counter for generating address signals used when the test data is written into the memory cells and the written data is read out from the memory cells in the memory test operation; 46 designates a group of defective cell position storage circuits; 52 designates a shift register; 381 designates a NOR gate; and 382 designates an AND gate. Each defective cell position storage circuit has a constitution the same as that of the first embodiment shown in FIG. 3. However, each defective cell position storage circuit is provided in a form that each defective cell position storage circuit corresponds to each bit of the 72 bit data. Since 72-bit data are simultaneously written or read, all defective cell position storage circuits also operate simultaneously.

Figure 9A:
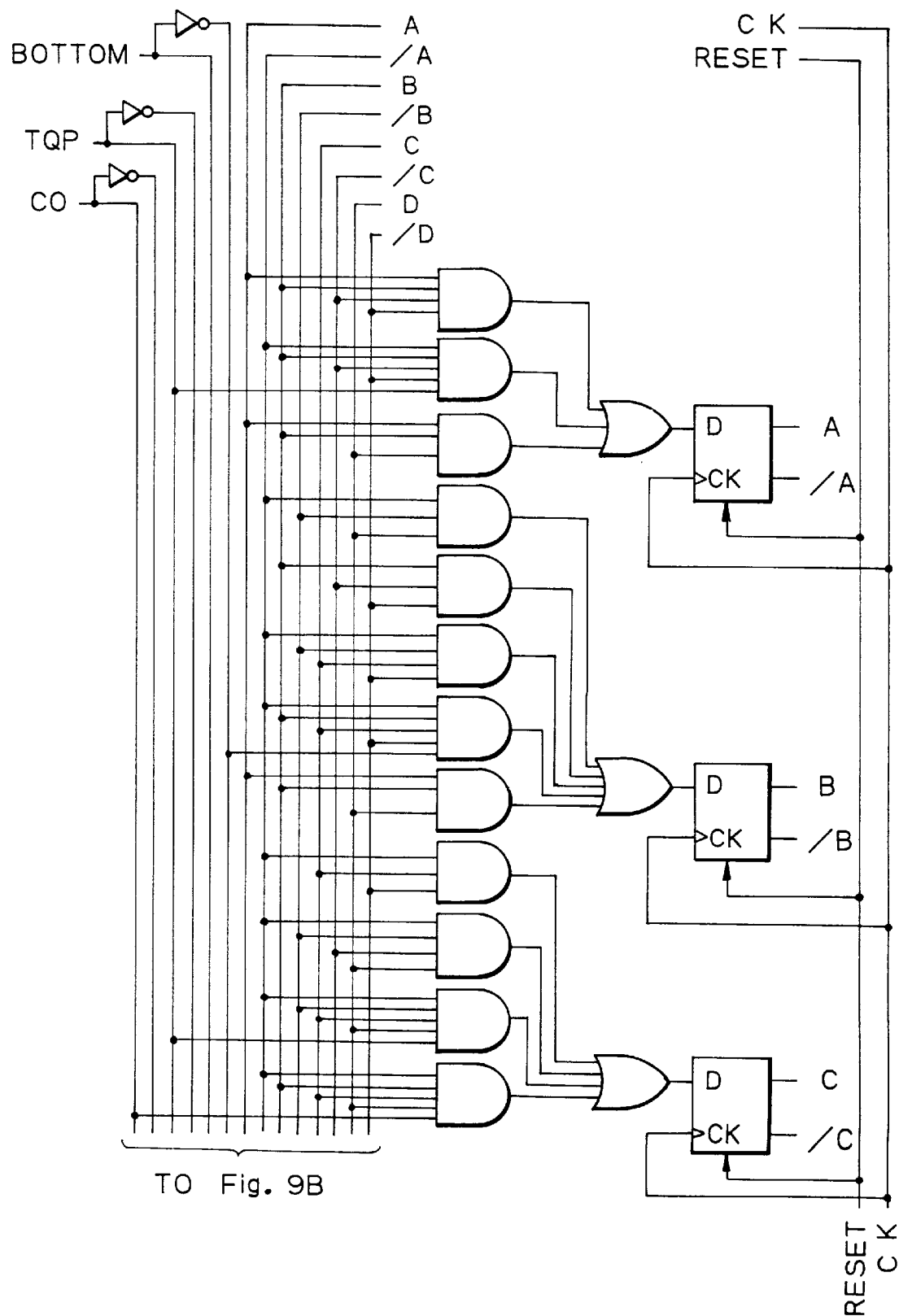
FIGS. 9A and 9B are circuit diagrams showing a constitution of a sequence controller of the third embodiment.
Figure 9B:
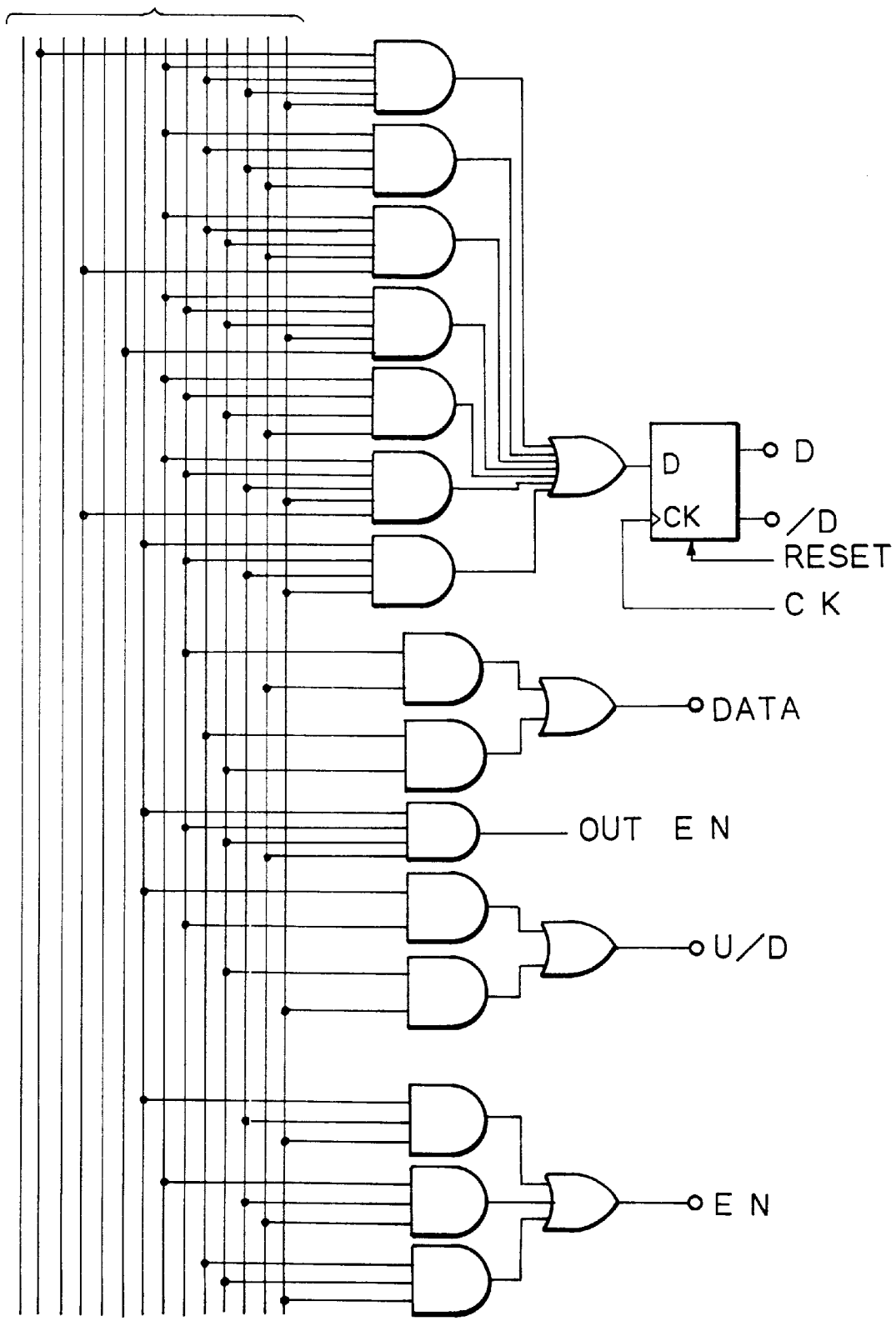

FIGS. 9A and 9B are diagrams showing a constitution of the sequence controller 36. As shown in figures, the sequence controller 36 receives a clock signal CK; a carry out signal CO; an address top signal TOP; and an address bottom signal BOTTOM. Further, the sequence controller 36 outputs an enable signal EN; a counter up/down signal U/P; a data switching signal DATA; and an output enable signal OUT EN. Only an operation of the sequence controller 36 is explained later, and an explanation relating to the constitution of the sequence controller 36 is omitted because this constitution does not directly relate to the present invention.

Figure 10:
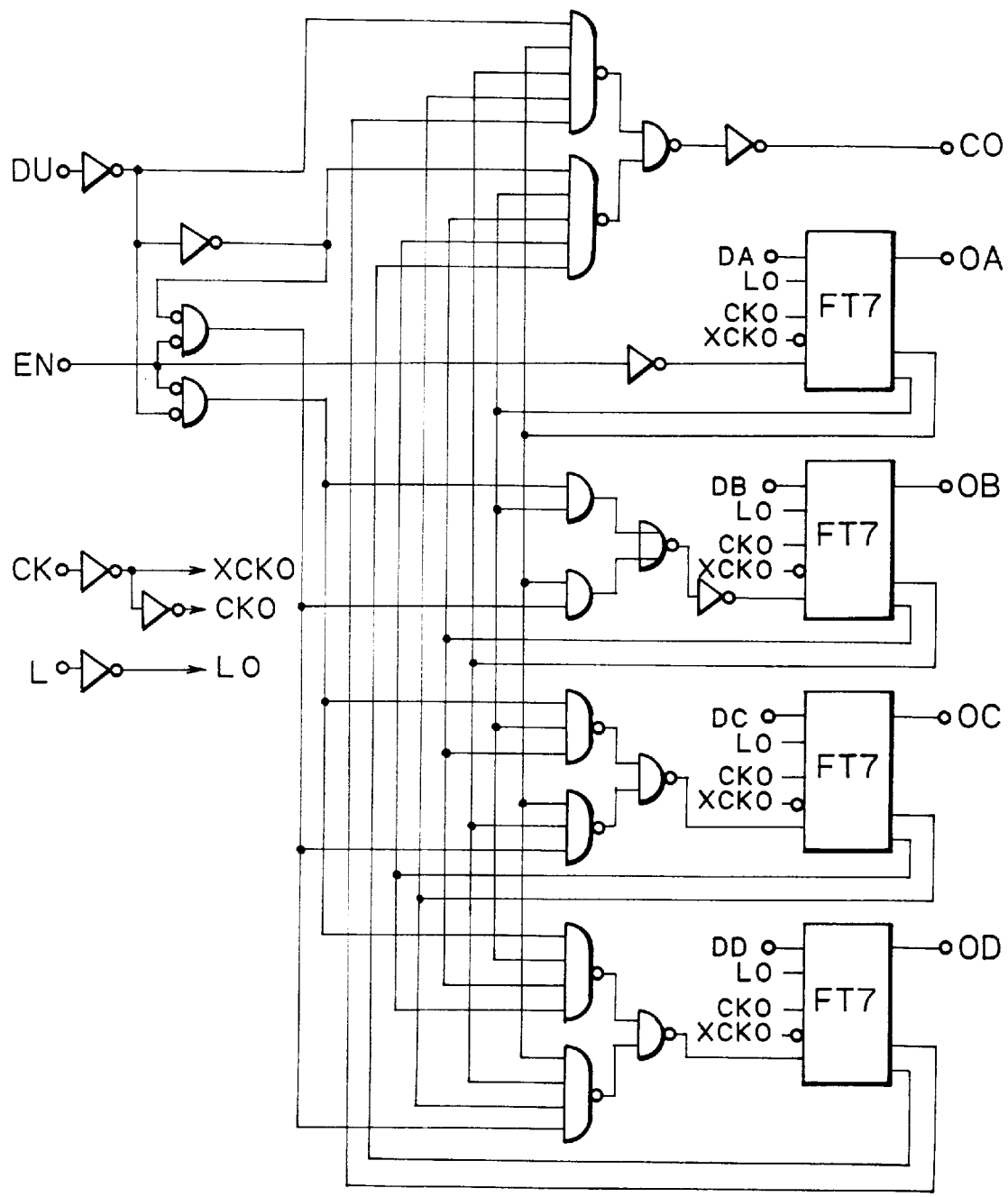
FIG. 10 is a circuit diagram showing a constitution of an address counter of the third embodiment.
Figure 11:
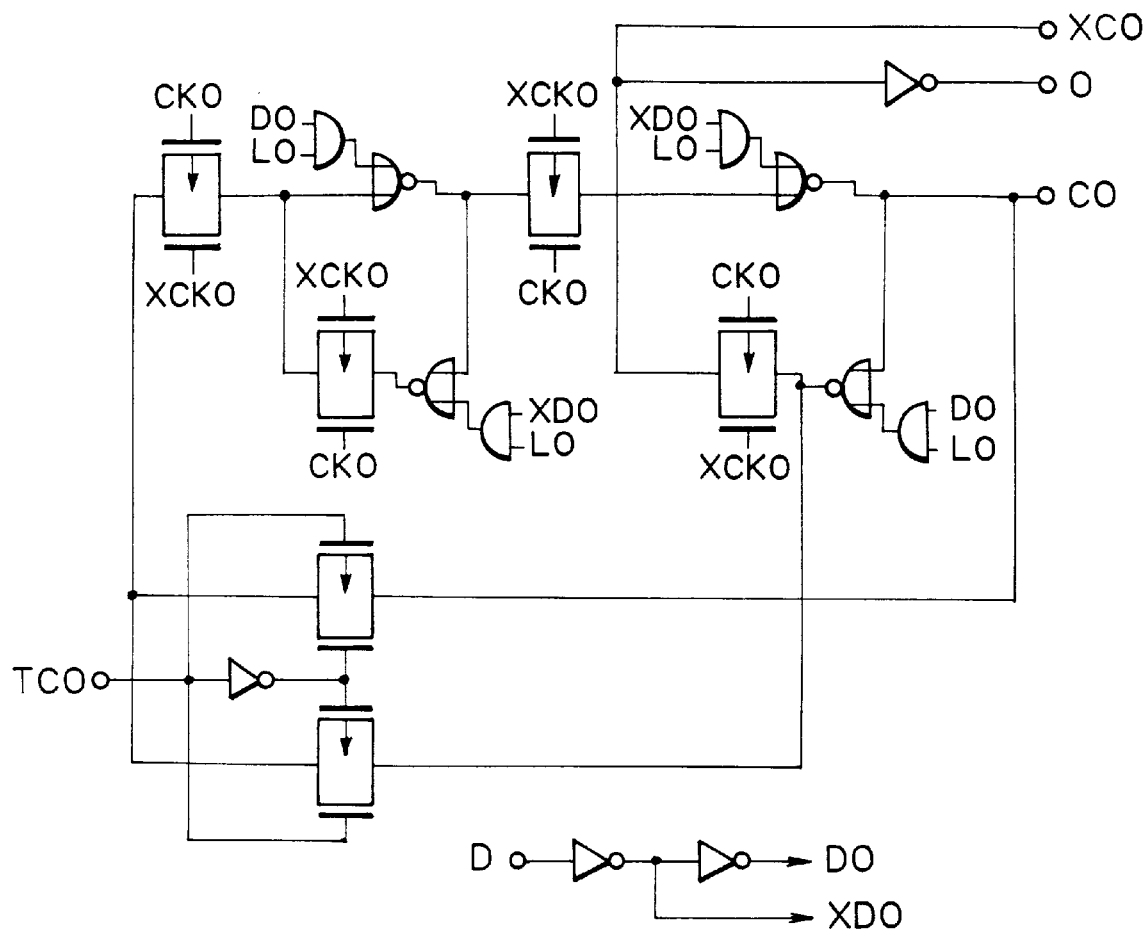
FIG. 11 is a circuit diagram showing a constitution of a block portion of the address counter of the third embodiment.

FIG. 10 is a circuit diagram of one of the up/down counter units composing the address generation counter 38, and FIG. 11 is a circuit diagram of a block portion FT7 of FIG. 10.

The constitution of the up/down counter unit shown in FIGS. 10 is well-known, therefore, a detailed explanation relating to the constitution of the up/down counter unit is omitted. Because the up/down counter unit shown in FIG. 10 outputs only 4-bit addresses signals, a plurality of counter units are connected in a cascade by connecting a carry out signal CO to an input terminal of the enable signal EN of the next counter unit when more than 4-bit addresses signals are necessary. When a plurality of the counter units are connected, the enable signal EN of the last counter unit is output to outside.

The address generation counter 38 receives a reset signal RESET, the clock signal CK, the counter up/down signal U/P and the enable signal EN, and outputs address signals and the carry out signal CO.

Figure 12:
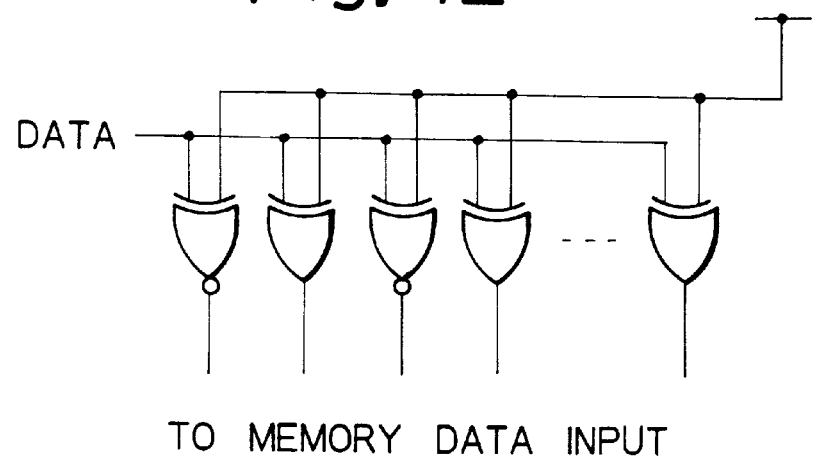
FIG. 12 is a circuit diagram showing a constitution of a data generation circuit of the third embodiment.

FIG. 12 is a circuit diagram showing a constitution of the data generation circuit 37.

As shown in FIG. 12, the data generation circuit 37 includes a plurality of Exclusive OR gates and Exclusive NOR gates to which the data switching signal DATA and a signal fixed to "High" are commonly input. Therefore, different signals are output from each pair of the Exclusive OR gate and Exclusive NOR gate, and each output from the Exclusive OR gates and Exclusive NOR gates can be inversed by changing the logic state of the data switching signal DATA. Outputs from the Exclusive OR gates and Exclusive NOR gates are output to the data bus of the memory portion 11 and to the defective cell position storage circuit 46. Therefore, when the memory portion 11 has the data bus constitution of 72 bits, the number of pairs of the Exclusive OR gates and Exclusive NOR gates is 36.

Figure 13:
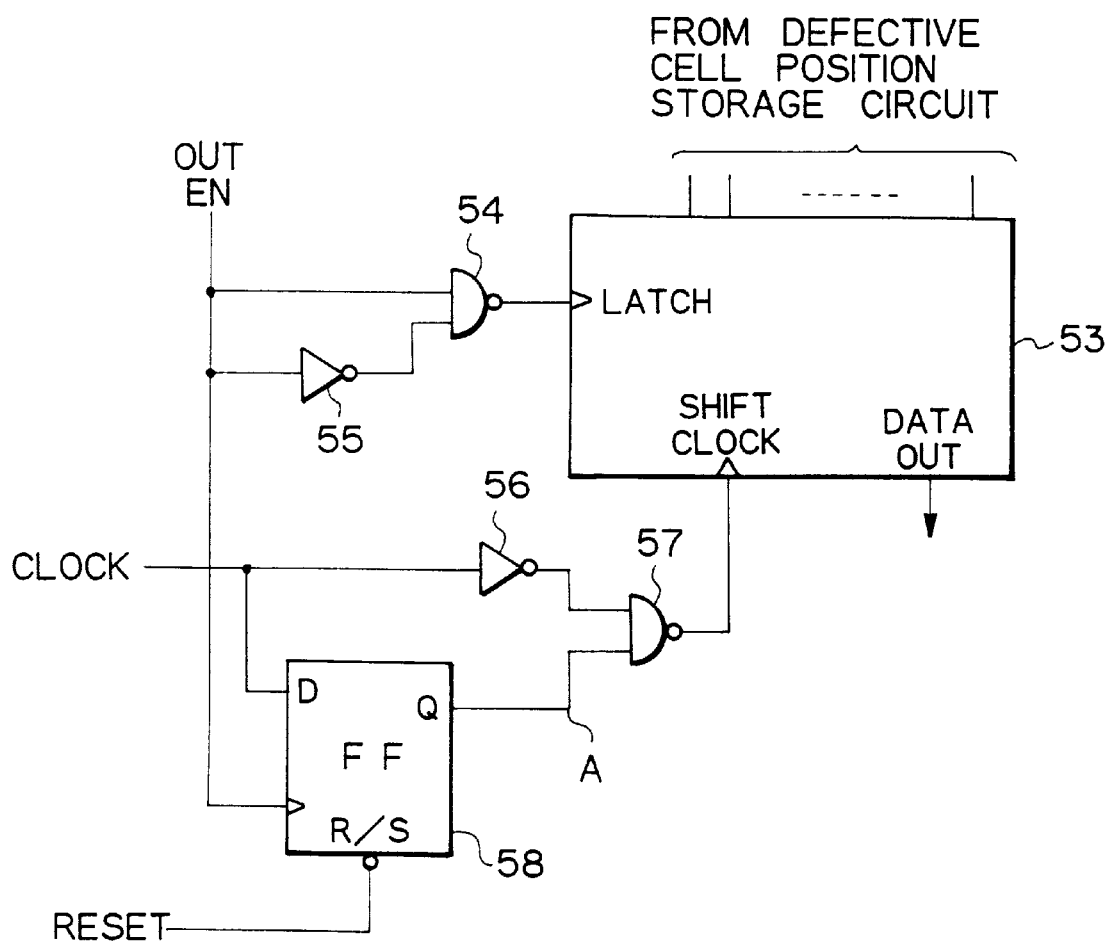
FIG. 13 is a circuit diagram showing a constitution of a shift register of the third embodiment.
Figure 14:
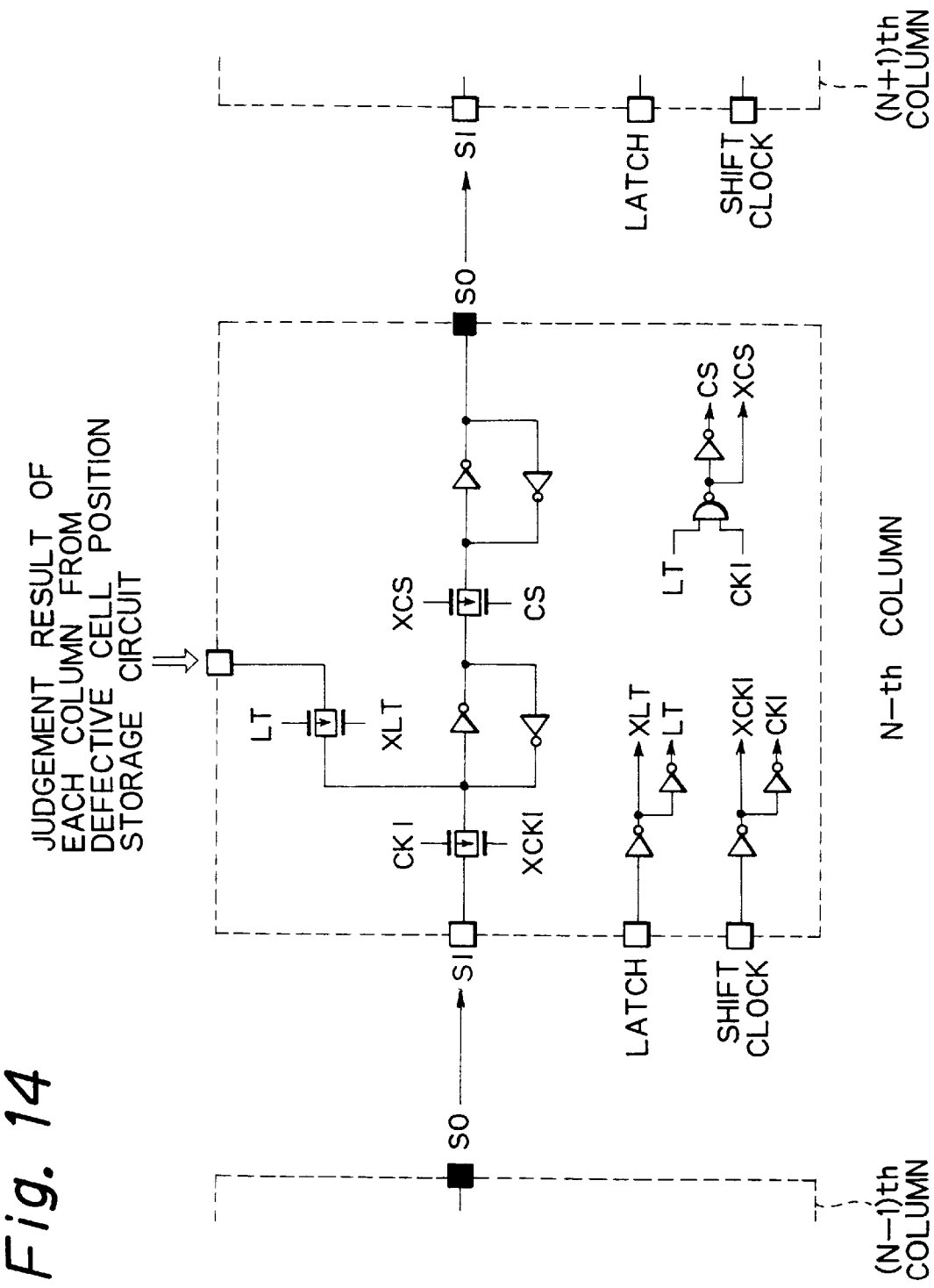
FIG. 14 is a circuit diagram showing a constitution of a block portion of the shift register of the third embodiment.
Figures 16A, 16B, 16C, 16D, 16E, 16F, 16G, 16H, 16I:
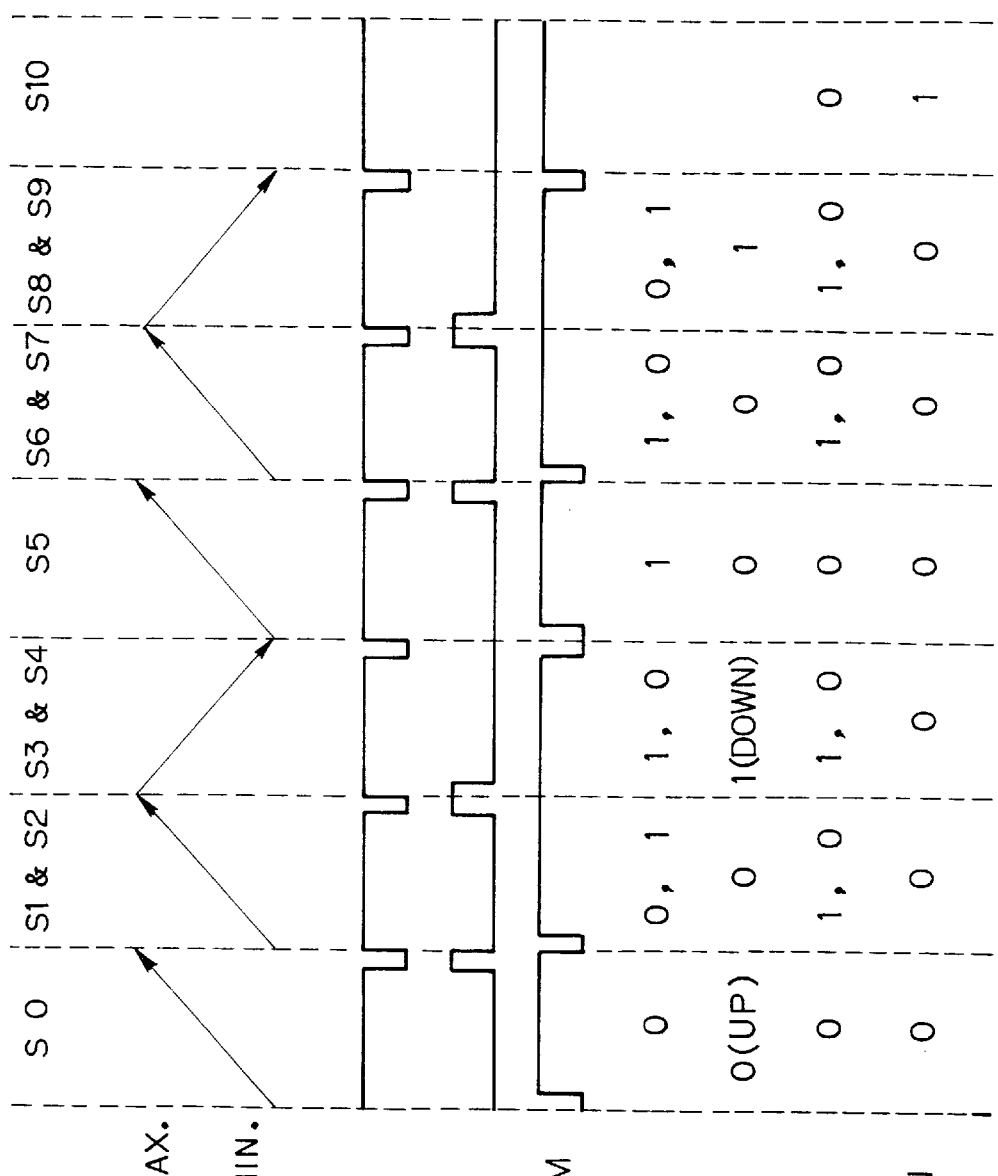
FIGS. 16A to 16I are time-charts showing operations of the self-diagnostic circuit of the third embodiment.

FIG. 13 is a circuit diagram showing a constitution of the shift register 52. The main portion 53 of the shift register 52 is composed of master-slave flip-flops having transmission gates shown in FIG. 14. A plurality of master-slave flip-flops, namely, 72 master-slave flip-flops are connected in a form that a serial data output SO of a master-slave flip-flop is connected to a serial data input SI of the next master-slave flip-flop. A test result of whether or not each data bit array of the memory portion 11 has at least one defective cell is input to a data input terminal of each master-slave flip-flop. The master-slave flip-flop latches the test result according to the latch signal LATCH, and transfers the latched data to the next master-slave flip-flop according to the shift clock signal. Therefore, when only the shift clock is applied, the latched data is sequentially transfered along a chain of the master-slave flip-flops.

FIGS. 15A to 15E show operations of the shift register 52 of the third embodiment. This operation of the shift register 52 is explained in the following with reference to these figures.

The clock signal CK periodically changes its state between "High" and "Low". A flip-flop 58 is previously reset, and the reset signal is held "High". In this state, an output of an AND gate 57 is held "High". When the output enable signal OUT EN changes to "High" while the clock signal CK is "High", a latch pulse is generated by an AND gate 54 and an inverter gate 55 which operates a delay element. Because the output enable signal OUT EN is also input to the flip-flop 58 and the clock signal CK input to the data terminal of the flip-flop 58 is "High", an output of the flip-flop 58 changes to "High" in response to the upward edge of the output enable signal OUT EN. Namely, a potential of a node A becomes "High". When the potential of the node A is "High", the AND gate 57 operates as an inverter gate, therefore, the clock signal CK is supplied to an input terminal of the main portion 53 of the shift register 52. Consequently, latched data according to the latch pulse are sequentially transfered along the chain of the master-slave flip-flops.

Figure 17:
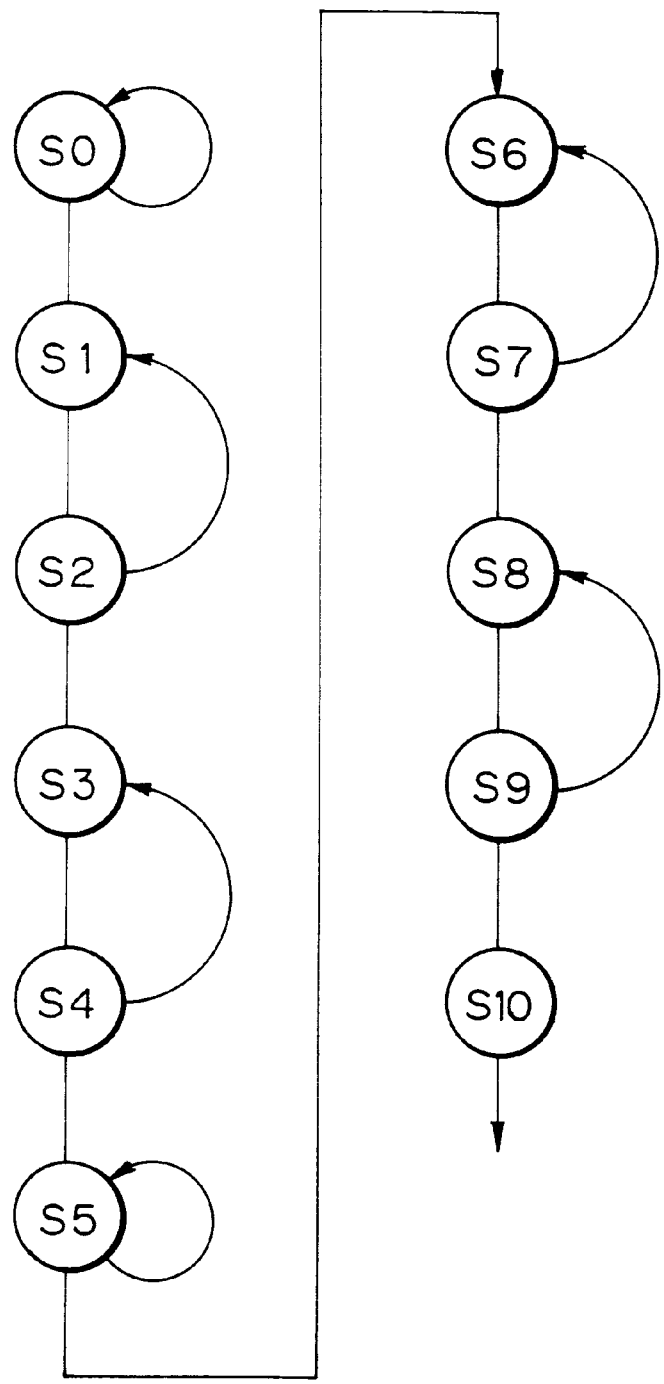
FIG. 17 is a state transition diagram of the operations shown in FIG. 16.

FIGS. 16A to 16I are time-charts showing operation of a memory test of the third embodiment. A written and read data pattern of this embodiment is more complicated than that of the first embodiment. In this embodiment, a so-called "MARCH" pattern is used. The memory test is composed of seven stages. In each stage, one or two operations of steps S1 to S12 are carried out. FIG. 17 is a state transition diagram of the steps in the memory test.

The sequence controller 36 outputs the enable signal EN, the counter up/down signal U/D, the data switching signal DATA and the output enable signal OUT EN which change as shown in FIGS. 16F to 16I. The address top signal TOP changes to "High" when all address signals become "High", and the address bottom signal BOTTOM changes to "Low" when all address signals become "Low". The carry out signal CO changes to "Low" when all address signals become "High" in the up-count operation or all address signals become "Low" in the down-count operation. The output enable signal OUT EN is set to "1 (High)" only in the step 10 in which the test result is read out. As described above, the written data of neighboring data bus bits are different, and the written data is switched to the other data when the data switching signal DATA is changed. In the specification, when the data switching signal DATA is set to "0", it is stated that the data "0" is written although "0" and "1" are respectively written into neighboring data bits. Further, although a write enable signal and a read enable signal are not shown, these signals are automatically generated by the sequence controller.

In the first stage, a step S0 is repeated. The step S0 is an operation in which the data "0" is written into the memory cell. The step S0 is repeated by increasing the address value from the minimum address value to the maximum address value.

In the second stage, a pair of steps S1 and S2 are repeated. The step S1 is an operation in which the written data is read out from the memory cell, and the read data is compared with the data written in the first stage. The step S2 is an operation in which the data "1" is written into the memory cell. The step S2 is immediately carried out for the same memory cell for which the step S1 is carried out after the step S1 is carried out. The pair of steps S1 and S2 are repeated for every memory cell by increasing the address value from the minimum address value to the maximum address value.

In the third stage, a pair of step S3 and S4 are repeated. The step S3 is an operation in which the written data is read out from the memory cell, and the read data is compared with the data written in the second stage. The step S4 is an operation in which the data "0" is written into the memory cell. The step S4 is immediately carried out for the same memory cell for which the step S3 is carried out after the step S3 is carried out. The pair of steps S3 and S4 are repeated for every memory cell by decreasing the address value from the maximum address value to the minimum address value.

In the fourth stage, a step S5 is repeated. The step S5 is an operation in which the data "1" is written into the memory cell. The step S5 is repeated so that the data "1" is written into every memory cell by increasing the address value from the minimum address value to the maximum address value.

In the fifth stage, a pair of steps S6 and S7 are repeated. The step S6 is an operation in which the written data is read out from the memory cell, and the read data is compared with the data written in the fourth stage. In the step S7, the data "0" is written into the memory cell. The step S7 is immediately carried out for the same memory cell for which the step S6 is carried out after the step S6 is carried out. The pair of steps S6 and S7 are repeated for every memory cell by increasing the address value from the minimum address value to the maximum address value.

In the sixth stage, a pair of steps S8 and S9 are repeated. The step S8 is an operation in which the written data is read out from the memory cell, and the read data is compared with the data written in the fifth stage. The step S9 is an operation in which the data "1" is written into the memory cell. The step S9 is immediately carried out for the same memory cell for which the step S8 is carried out after the step S8 is carried out. The pair of steps S8 and S9 is repeated for every memory cell by decreasing the address value from the maximum address value to the minimum address value.

In the seventh stage, a step S10 is carried out. The step S10 is an operation in which, as described with reference to FIGS. 15A to 15I, a test result of each column is latched by the shift register 52 and it is transferred to outside.

For comparison of the present invention with a prior art, examples in which the LSI shown in FIG. 7 is assumed to be tested by a prior art are described. A first example is shown in FIG. 18.

Figure 18:
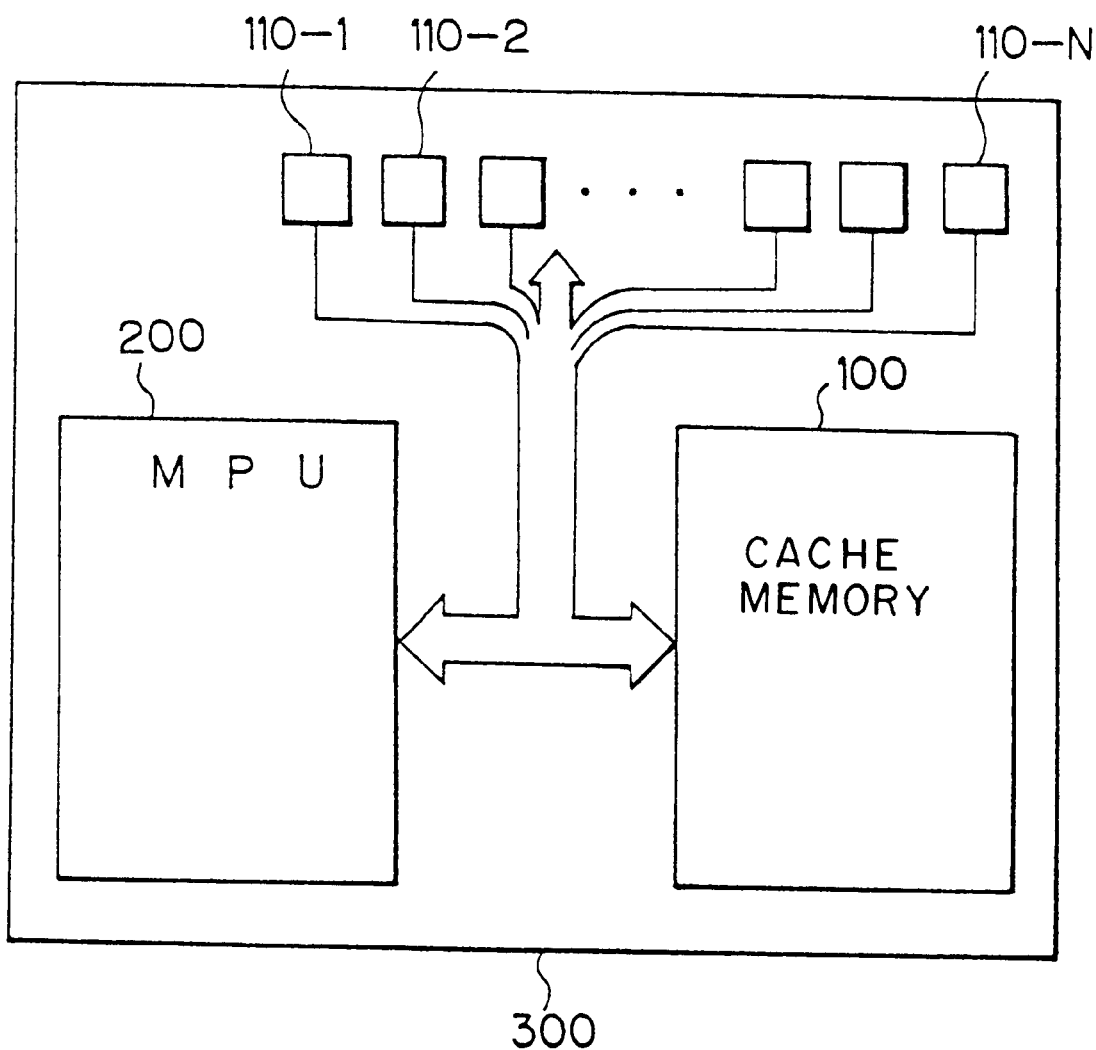
FIG. 18 is a block diagram showing a constitution of a semiconductor device of a first example of a prior art in which a memory test to detect positions of defective memory cells for replacing the defective memory cells with a redundant circuit can be carried out.

As shown in FIG. 18, in this example, a plurality of electrode pads 110-1, 110-2, . . . , 110-M for accessing the memory device 100 are arranged in the LSI 300. Data signal lines, address signal lines and control signal lines to access to the memory device 100 are connected to the MPU 200. These lines are also connected to the electrode pads 110-1, 110-2, . . . , 110-M. In this way, the memory device 100 is accessable from outside.

Recently, the capacity of cache memories has been increasing, and therefore, a redundant circuit is indispensable for improving a production yield. In the cache memory shown in FIG. 7, the number of data bits is large in order to increase a data transfer speed between the MPU 200 and the cache memory 100. For example, a data bus constitution of 1024 words×72 bits is used. When the memory device 100 of the LSI shown in FIG. 18 is assumed to be this cache memory, 72 electrode pads are required for the data signal lines, 10 electrode pads are required for the address signal lines, and a few electrode pads are required for the control signal lines. Therefore, more than 80 electrode pads are required to be arranged in the LSI. In area of the electrode pads is much larger than other circuit elements because test probes contact to these electrode pads in the test operations. Therefore, an increase in the number of electrode pads increases the chip area of the LSI 300. Practically, it is difficult to arrange more than 80 electrode pads in the LSI chip.

Figure 19:
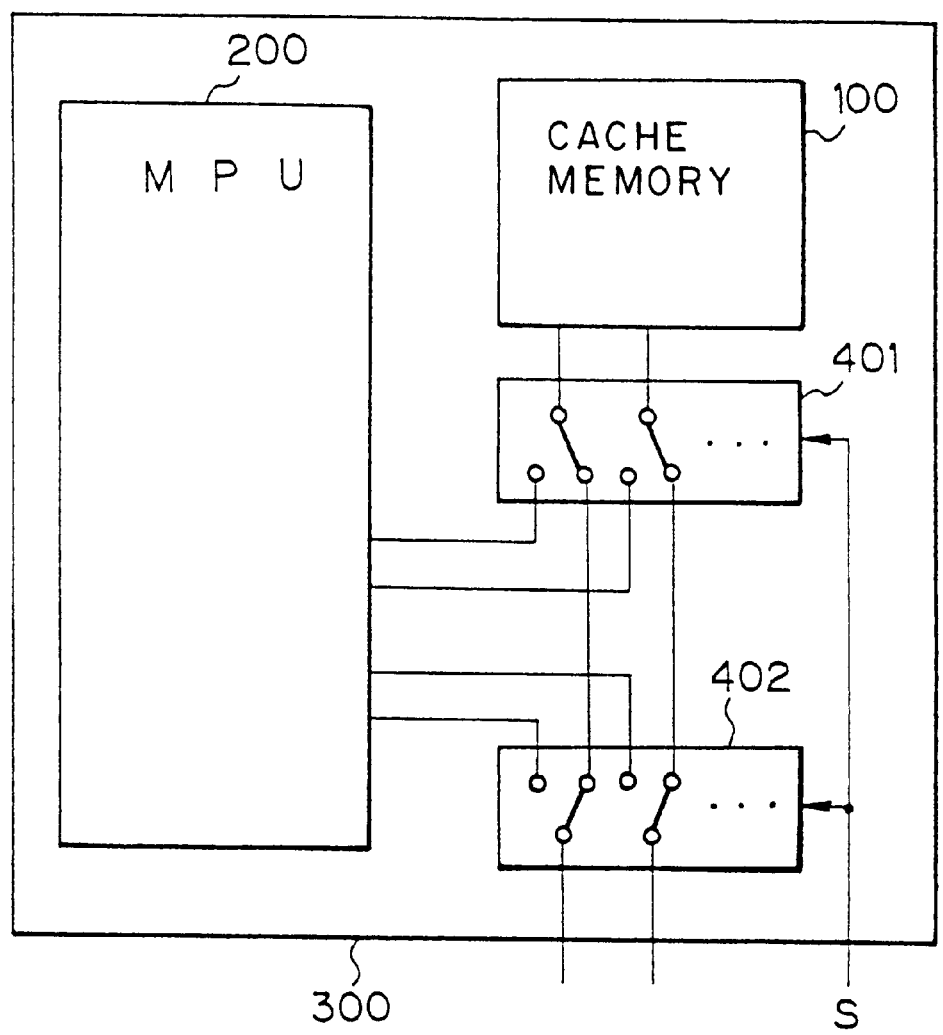
FIG. 19 is a block diagram showing a constitution of a semiconductor device of a second example of a prior art in which a memory test can be carried out.

FIG. 19 shows a second example in which the memory device of the LSI shown in FIG. 7 can be tested. In this example, two selectors 401 and 402 are arranged to switch wirings between the I/O terminals and the MPU 200 to be connected between the I/O terminals and the memory device 100 only when the memory device is tested. In this way, the memory device can be tested. In the figure, S designates an input terminal through which switching signals of the selectors 401 and 402 are input. By simultaneously applying this switching signal through the selectors 401 and 402, the memory device 200 is accessable from outside through the I/O terminals.

However, the circuit constitution shown in FIG. 19 further includes the selectors 401 and 402 and the wirings to connect to these selectors. Therefore, the circuit constitution shown in FIG. 19 also increases the area of the LSI.

As described above, it is apparent that, by using the memory device of the present invention as an externally inaccessible memory device included in the LSI as shown in FIG. 7, the memory test for replacing with the redundant circuit can be carried out without increasing the number of the I/O terminals and increasing the scale of the circuit.

Figure 4:
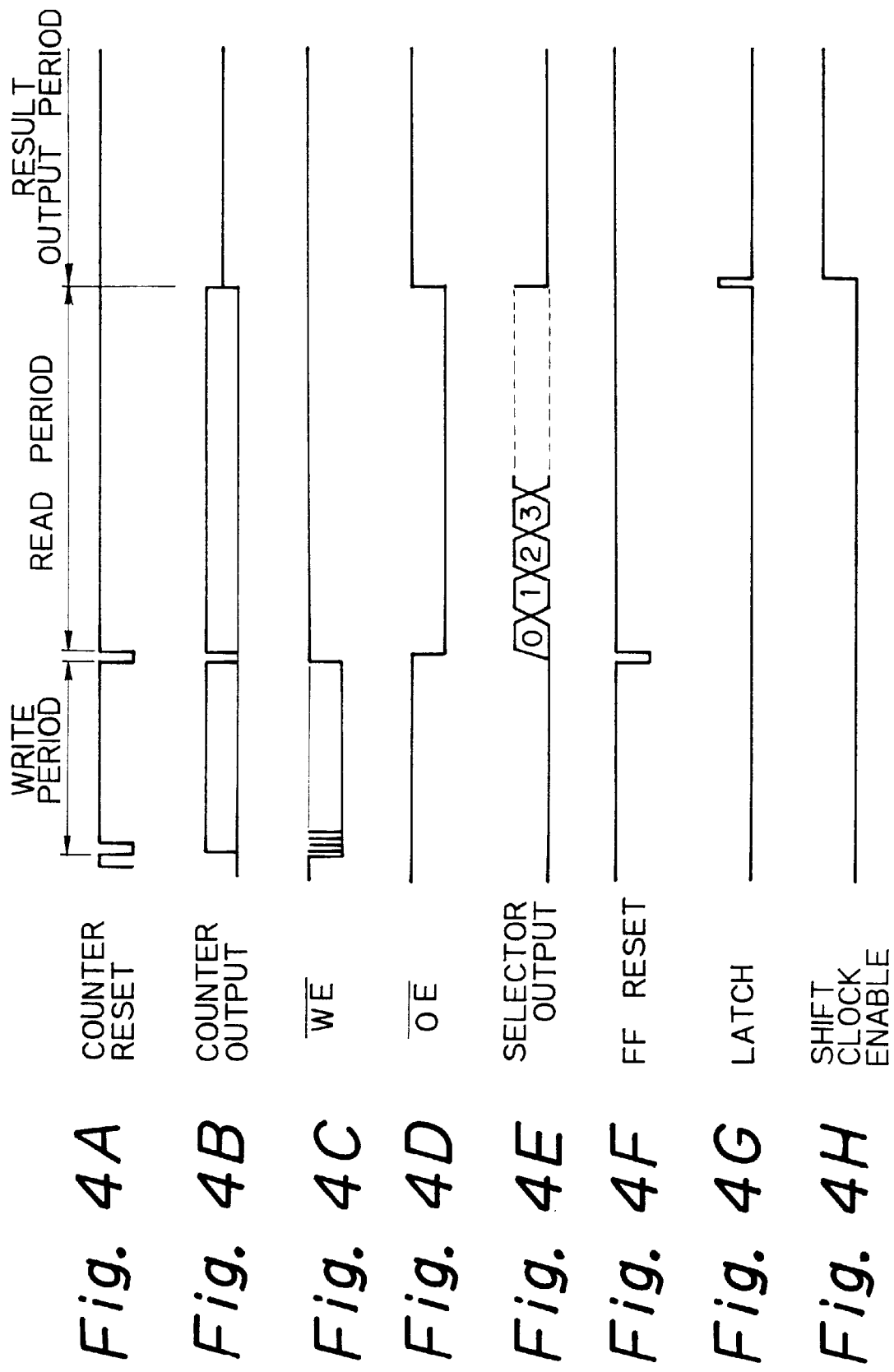
FIGS. 4A to 4H are time-charts showing operations of the self-diagnostic circuit, the defective cell position storage circuit and the output circuit of the first embodiment.

In the embodiments described above, a detecting circuit to detect defective memory cells and a storage circuit to store positions of defective memory cells are simultaneously realized by the defective cell position storage circuits 41-1, . . . , 41-N arranged at each column. However, a detecting circuit and a storage circuit can be realized by another constitutions. For example, only one defective cell position storage circuit 41-i shown in FIG. 4 is provided, and a plurality of registers corresponding to a number of the redundant memory cell arrays are provided. The registers latch a column address signal when the defective cell position storage circuit 41-i detects a first defective memory cell in each column. When a register latches the column address, the register is cut off from the defective cell position storage circuit 41-i and the next register is connected to the defective cell position storage circuit 41-i by a switch circuit. The defective cell position storage circuit 41-i is reset when a memory test of each column starts. When every memory cell has been tested, the contents of the registers are latched into a shift register and are output as serial data. When this circuit operates as a self-diagnostic circuit after the device is embedded into an apparatus, the defective cell position storage circuit 41-i continues to operate without resetting after one initial reset at the start of a test. In this way, the defective cell position storage circuit 41-i outputs a signal "High" when at least one defective memory cell exist in the device.

Alternatively, by adding a function to detect and store positions of defective memory cells to the self-diagnostic circuit, information necessary to replace defective memory cells with the redundant circuit can be obtained.

Many widely different embodiments of the present invention may be constructed without departing from the spirit of the present invention, and it should be understood that the present invention is not limited to the specific embodiments described in this specification, except as defined in the appended claims.

What is claimed is:

1. A semiconductor memory device, comprising:
   a normal memory portion having a memory cell matrix which is formed of a plurality of memory cells arranged at intersections of word lines and bit lines;
   a redundant circuit portion having memory cell arrays and operably coupled to said normal memory portion for replacing a defective memory cell in said normal memory portion in a form such that all memory cells connected to the word line or the bit line to which said defective memory cell is connected are replaced;
   a self-diagnostic circuit, operably coupled to said normal memory portion, for testing whether or not all memory cells operate normally;
   a defective cell position storage circuit, operably coupled to said self-diagnostic circuit, for storing a position of either a word line or a bit line connected to said defective memory cell when said self-diagnostic circuit detects said defective memory cell; and
   an output circuit, operably coupled to said defective cell position storage circuit, for converting, within said semiconductor memory device, position information indicating said position of said word line or bit line connected to said defective memory cell stored in said defective cell position storage circuit into serial data and for outputting converted position information out of said semiconductor memory device so that said position of said word line or bit line connected to said defective memory cell can be determined and thereafter replaced.

2. A semiconductor device of claim 1, wherein said defective cell position storage circuit stores the results of a plurality of test operations which are carried out serially.

3. A semiconductor device of claim 1, wherein said defective cell position storage circuit includes an Exclusive OR gate, an OR gate, an AND gate and a flip-flop.

4. A semiconductor device of claim 1, wherein said output circuit includes a shift register which converts said data stored in said defective cell position storage circuit into serial data and outputs said serial data.

5. A semiconductor device of claim 1, further comprising a test data generation circuit, operably coupled to said normal memory portion and said defective cell position storage circuit, for generating data for test data read into said normal memory portion and used in said defective cell position storage circuit.

6. A semiconductor device of claim 1, wherein said self-diagnostic circuit includes a sequence controller, operably coupled to said normal memory portion and said output circuit, which generates control signals used for testing whether or not all memory cells operate normally.

7. A semiconductor device of claim 1, wherein said self-diagnostic circuit tests whether or not all memory cells operate normally, in a plurality of stages.

8. A semiconductor device, comprising:
   (1) a semiconductor memory device which comprises:
       a normal memory portion having a memory cell matrix which is formed of a plurality of memory cells arranged at intersections of word lines and bit lines;

a redundant circuit portion having memory cell arrays and operably coupled to said normal memory portion for replacing a defective memory cell in said normal memory portion in a form such that all memory cells connected to the word line or the bit line to which said defective memory cell is connected are replaced, a self-diagnostic circuit, operably coupled to said normal memory portion, for testing whether or not all memory cells operate normally, a defective cell position storage circuit, operably coupled to said self-diagnostic circuit, for storing a position of either a word line or a bit line connected to said defective memory cell when said self-diagnostic circuit detects said defective memory cell, and an output circuit, operably coupled to said defective cell position storage circuit, for converting, within said semiconductor memory device, position information indicating said position of said word line or bit line connected to said defective memory cell stored in said defective cell position storage circuit into serial data and for outputting said position information out of said semiconductor memory device so that said position of said word line or bit said connected to said defective memory cell can be determined and thereafter replaced;

(2) logic circuit device operably coupled to said semiconductor memory device; and (3) a plurality of input and output terminals, wherein, said semiconductor memory device is accessible from said logic circuit device and is not accessible from said input and output terminals, and said serial data of said output circuit of said semiconductor memory device are outputted through a part of said input and output terminals.

9. A semiconductor device of claim 8, wherein said defective cell position storage circuit stores the results of a plurality of test operations which are carried out serially.

10. A semiconductor device of claim 8, wherein said defective cell position storage circuit includes an Exclusive OR gate, an OR gate, an AND gate and a flip-flop.

11. A semiconductor device of claim 8, wherein said output circuit includes a shift register which converts said data stored in said defective cell position storage circuit into serial data and outputs said serial data.

12. A semiconductor device of claim 8, further comprising a test data generation circuit, operably coupled to said normal memory portion and said defective cell position storage circuit, for generating data for test data read into said normal memory portion and used in said defective cell position storage circuit.

13. A semiconductor device of claim 8, wherein said self-diagnostic circuit includes a sequence controller, operably coupled to said normal memory portion and said output circuit, which generates control signals used for testing whether or not all memory cells operate normally.

14. A semiconductor device of claim 8, wherein said self-diagnostic circuit tests whether or not all memory cells operate normally, in a plurality of stages.

15. A semiconductor device of claim 8, wherein said semiconductor memory device is a cache memory.

* * * * *